United States Patent
Marsh et al.

(10) Patent No.: US 11,456,681 B2
(45) Date of Patent: Sep. 27, 2022

(54) MICRO ELECTROSTATIC ACTUATED PNEUMATIC DRIVEN MOTOR

(71) Applicant: Encite LLC, Burlington, MA (US)

(72) Inventors: Stephen A. Marsh, Carlisle, MA (US); Spencer Parker, Somerville, MA (US)

(73) Assignee: Encite LLC, Burlington, MA (US)

( * ) Notice: Subject to any disclaimer, the term of this patent is extended or adjusted under 35 U.S.C. 154(b) by 126 days.

(21) Appl. No.: 17/140,396

(22) Filed: Jan. 4, 2021

(65) Prior Publication Data
US 2021/0211068 A1    Jul. 8, 2021

Related U.S. Application Data

(60) Provisional application No. 62/958,371, filed on Jan. 8, 2020.

(51) Int. Cl.
*H02N 1/00*      (2006.01)
*F15B 15/08*     (2006.01)
(Continued)

(52) U.S. Cl.
CPC ........... *H02N 1/006* (2013.01); *B81B 3/0021* (2013.01); *F15B 15/088* (2013.01);
(Continued)

(58) Field of Classification Search
CPC ............... F16K 99/0001; F16K 99/051; F16K 2099/0071; F16K 99/0015; F16K 31/12;
(Continued)

(56) References Cited

U.S. PATENT DOCUMENTS 3,400,282 A    3/1968  Felici
5,492,185 A    2/1996  Schoeps et al.
(Continued)

FOREIGN PATENT DOCUMENTS

JP    2004-112884    8/2004

OTHER PUBLICATIONS

International Search Report and Written Opinion, PCT/US2021/012700, dated Mar. 25, 2021, 8 pages.
(Continued)

*Primary Examiner* — Burton S Mullins
(74) *Attorney, Agent, or Firm* — Fish & Richardson P.C.

(57) ABSTRACT

Described is an electrically actuated, pneumatic driven motor. The pneumatic driven motor includes a body having first and second surfaces, the body having a chamber defined by an interior wall, a displacement cavity, and a passage that fluidly couples the displacement cavity to the chamber, a bleeder port and a bleeder port passage that fluidly couples the bleeder port to the chamber, a valve disposed in the passage between the displacement cavity and the chamber, an annular pushrod mechanism coupled to the valve, the annular pushrod mechanism having a pair of pawls that protrude from an inner surface of the annular pushrod mechanism, an axle disposed in the chamber; and a motor gear disposed about the axle, the motor gear having a plurality of teeth that selectively engage with the pawls on the pushrod mechanism according to displacement of the annular pushrod mechanism.

36 Claims, 15 Drawing Sheets

(51) Int. Cl.
  *B81B 3/00*     (2006.01)
  *F16K 99/00*    (2006.01)
  *F16K 31/122*   (2006.01)

(52) U.S. Cl.
  CPC ...... *F16K 99/0051* (2013.01); *B81B 2201/03* (2013.01); *B81B 2201/054* (2013.01); *B81B 2203/06* (2013.01); *F16K 31/122* (2013.01); *F16K 99/0001* (2013.01); *F16K 2099/0071* (2013.01)

(58) Field of Classification Search
  CPC .... F16K 31/122; F16K 31/1225; F16K 31/42; F15B 15/00; F15B 15/088; H02N 1/006; B81B 3/0018; B81B 3/0021; B81B 3/0067; B81B 2201/037; B81B 2201/03; B81B 2201/034; B81B 2201/054; B81B 2201/058; B81B 2203/056; B81B 2203/06
  USPC .............................................. 310/309, DIG. 6
  See application file for complete search history.

(56) References Cited

U.S. PATENT DOCUMENTS

| | | | | |
|---|---|---|---|---|
| 5,631,514 | A * | 5/1997 | Garcia | F16H 21/16 310/40 MM |
| 5,959,376 | A * | 9/1999 | Allen | H02N 1/006 310/40 MM |
| 5,965,958 | A | 12/1999 | Robert et al. | |
| 6,155,139 | A | 5/2000 | Tanji | |
| 6,175,170 | B1 * | 1/2001 | Kota | H02N 1/008 310/40 MM |
| 6,211,599 | B1 * | 4/2001 | Barnes | G04C 3/12 310/40 MM |
| 6,334,761 | B1 * | 1/2002 | Tai | F16K 99/0001 137/859 |
| 6,359,757 | B1 | 3/2002 | Mallaty | |
| 6,745,567 | B1 * | 6/2004 | Mercanzini | B81B 3/0062 60/527 |
| 6,887,615 | B1 * | 5/2005 | Sherman | H01M 12/06 429/61 |
| 6,903,861 | B1 * | 6/2005 | Allen | G02B 6/357 359/872 |
| 7,735,216 | B2 * | 6/2010 | Schnabel | B81C 3/002 29/742 |
| 7,797,933 | B2 * | 9/2010 | Mankame | F16D 41/14 60/329 |
| 8,134,276 | B2 * | 3/2012 | Stalford | B81B 3/0059 310/306 |
| 8,159,107 | B2 * | 4/2012 | Stalford | H02N 10/00 310/306 |
| 8,282,284 | B2 * | 10/2012 | Stalford | B81B 3/0059 29/898.07 |
| 8,361,313 | B2 * | 1/2013 | Pancaldi | B01D 29/111 210/167.04 |
| 8,608,700 | B2 * | 12/2013 | Rubel | A61M 5/14216 604/67 |
| 8,926,465 | B2 * | 1/2015 | Stotz | F16H 1/32 310/40 MM |
| 9,194,384 | B2 * | 11/2015 | Bernstein | B01L 3/5027 |
| 10,838,366 | B2 * | 11/2020 | Burkhardt | G04C 3/12 |
| 10,885,422 | B2 * | 1/2021 | Spieth | G06M 1/101 |
| 2005/0081363 | A1 * | 4/2005 | Malshe | B81C 99/002 408/1 R |
| 2006/0116585 | A1 | 1/2006 | Nguyen-Dinh et al. | |
| 2007/0090722 | A1 * | 4/2007 | Mou | H02N 1/008 310/40 MM |
| 2008/0251041 | A1 | 10/2008 | Lou | |
| 2010/0024611 | A1 | 4/2010 | Starick et al. | |
| 2013/0255787 | A1 | 3/2013 | Frank et al. | |

OTHER PUBLICATIONS

International Search Report and Written Opinion, PCT/US19/35536, dated Oct. 24, 2019, 10 pages.

* cited by examiner

US 11,456,681 B2

MICRO ELECTROSTATIC ACTUATED PNEUMATIC DRIVEN MOTOR

CLAIM OF PRIORITY

This application claims priority under 35 USC § 119(e) to U.S. Provisional Patent Application Ser. No. 62/958,371, filed on Jan. 8, 2020, and entitled "Micro Electrostatic Actuated Pneumatic Driven Motor," the entire contents of which are hereby incorporated by reference.

BACKGROUND

This specification relates to miniature motors.

A motor is a machine that converts one form of energy into mechanical energy. There are various types of motors, such as electric motors. There are various types of various fabrication techniques and technologies used to construct such electric motors. Selection of both a motor type and a fabrication technology are driven by performance, application suitability and cost considerations. Most electric motors include a stator (stationary element that has a magnetic field) and a rotor that rotates and has conductors that carry currents. The electric motor operates through an interaction between the motor's magnetic field and the currents generated in the conductors of the rotor.

Another type of electric motor is an electrostatic motor. Electrostatic motors operate using capacitive effects based on attraction and repulsion of electric charges.

Also well-known are force transfer devices such as gears. Examples of electrostatic motors and force transfer devices fabricated with micro fabrication techniques are disclosed in US Patent Publication US-2019-0379303-A1, entitled "Micro Electrostatic Motor and Micro Mechanical Force Transfer Devices." The entire contents of this US Patent Publication are incorporated herein in its entirety.

Another type of motor is a so-called "pneumatic motor" that does mechanical work by converting compressed air energy to mechanical work through either linear or rotary motion.

SUMMARY

According to an aspect, a pneumatic driven motor includes a body having first and second surfaces, the body having a chamber defined by an interior wall, a displacement cavity, and a passage that fluidly couples the displacement cavity to the chamber, a bleeder port and a bleeder port passage that fluidly couples the bleeder port to the chamber, a valve disposed in the passage between the displacement cavity and the chamber, an annular pushrod mechanism coupled to the valve, the annular pushrod mechanism having a pair of pawls that protrude from an inner surface of the annular pushrod mechanism, an axle disposed in the chamber, and a motor gear disposed about the axle, the motor gear having a plurality of teeth that selectively engage with the pawls on the pushrod mechanism according to displacement of the annular pushrod mechanism.

The above aspect may include amongst other features one or more of the following features:

The body further has a confinement chamber, and the bleeder port is coupled to the chamber through the confinement chamber. The pneumatic driven motor further includes a first membrane disposed over the first surface and affixed to first portions of the body, the membrane covering at least the displacement cavity. The body and the membrane are a first body and a first membrane, the pneumatic driven motor further includes a second body having first and second surfaces and a second membrane disposed over one of the first and second surfaces of the second body, and affixed to at least portions of the second body, with the second membrane covering at least the displacement cavity.

The pneumatic driven motor further includes first and second electrodes supported on portions of the first and second membranes that are over the displacement cavity. The electrodes are configurable to receive electrical drive signals that cause flexure of the portions of the first and second membranes over the displacement cavity.

Flexure of the first and second membranes is translated into a linear reciprocating motion of the annular pushrod for rotating the motor gear in one direction, through displacement of air from the displacement cavity. A first state of the electrical signals cause the flexure of the portions of the membranes towards each other displacing air in the displacement cavity and causing linear motion of the pushrod in a first direction, and a second state of the electrical signals cause the flexure of the portions of the membranes away from each other sucking air into the displacement cavity and causing linear motion of the pushrod in a second, opposite direction.

The membrane has an annular aperture in a region of the membrane over the axle, which annular aperture defines a central region of the membrane that is affixed to a surface of the axle. The annular aperture in the at least one of the first and second membranes is a first annular aperture, and at least one of the first and second membranes has a second annular aperture spaced from the first annular aperture.

The second body and the second membrane are coupled the a first surface of the first body and the first membrane, the pneumatic driven motor further includes a third body having first and second surfaces, a third membrane disposed over one of the first and second surfaces of the third body, and with the third body affixed to a portion of the first membrane, with the third membrane covering at least the displacement cavity, and a transfer layer that is coupled to one of the third membrane, with the transfer layer configured to transfer rotation motion of the motor gear to an external portion of the transfer layer by either a shaft or an axle.

The pneumatic driven motor further includes a gear mechanism disposed over the body and coupled to the motor gear to transfer rotational motion of the motor gear to the gear mechanism.

The displacement cavity is a first displacement cavity, the valve is a first valve, the bleeder port and the bleeder port passage are a first bleeder port and a first bleeder port passage and the confinement chamber is a first confinement chamber, and the body further has a second displacement cavity, a second valve a second bleeder port, a second bleeder port passage that fluidly couples the second bleeder port to the chamber, and a second confinement chamber.

The body is a first body, the pneumatic driven motor, further includes a first membrane disposed over one of the first and second surfaces of the first body and affixed to at least portions of the first body, with the first membrane covering at least the first and second displacement cavities, a second body having first and second surfaces, and a second membrane disposed over one of the first and second surfaces of the second body, and affixed to at least portions of the second body, with the second membrane covering at least the first and second displacement cavities.

The first and second membranes each support a first set of electrodes over the first displacement cavity and a second set of electrodes over the second displacement cavity.

The pneumatic driven motor translates the vertical motion of the first and second membranes using displaced air into a linear reciprocating motion for rotating the motor gear in one direction. The electrodes are configured to receive electrical drive signals that cause flexure of the portions of the first and second membranes over the first and second displacement cavities. The pneumatic driven motor wherein a first state of the electrical signals cause the portions of the membranes that are over the first displacement cavity to flex towards each other displacing air in the first displacement cavity and cause the portions of the membranes that are over the second displacement cavity to flex away from each other sucking air into the second displacement cavity, and a second state of the electrical signals cause the portions of the membranes that are over the second displacement cavity to flex towards each other displacing air in the second displacement cavity and cause the portions of the membranes that are over the first displacement cavity to flex away from each other sucking air into the first displacement cavity, with the first and second set of electrical signals causing linear, reciprocating motion of the pushrod to rotate the motor gear in one direction.

The first bleeder port and the first bleeder port passage and the second bleeder port and the second bleeder port passage are coupled to the first displacement cavity and the second displacement cavity, and the pneumatic driven motor further includes a third bleeder port and a third bleeder port passage that are coupled to the first displacement cavity and a fourth bleeder port and a fourth bleeder port passage that are coupled to the second displacement cavity.

The motor gear has plural gear teeth that are attached to an outer edge of the motor gear at a non-normal angle with respect to the outer edge. The pawls on the pushrod sequentially engage with the plural gear teeth of the motor gear. Spacing between teeth of the plural teeth of the motor gear, the non-normal angle, and number of teeth are selected such that a single tooth of the plural teeth of the motor gear engages with a corresponding one of the pawls for each displacement of air from the displacement cavity. Engaging with the single tooth turns the motor gear one fraction of a revolution that is given by ½n where n is the number of teeth on the motor gear. Engaging with two teeth turns the motor gear one fraction of a revolution that is given by 1/n where n is the number of teeth on the motor gear. The spacing between teeth of the plural teeth of the motor gear, a non-normal angle of attachment of the plural teeth to the edge of the motor gear, the number of teeth on the motor gear, and a distance of linear travel of the pushrod, are selected such that the two teeth alternately engage with the corresponding pawls for each displacement of air from the first and second displacement cavities, turning the motor gear one fraction of a revolution given by 1/n where n is the number of teeth on the motor gear.

According to an additional aspect a pneumatic driven motor includes a body having first and second surfaces and having a chamber that is defined by an interior wall, with the body further having first and second displacement cavities and first and second passages that couple the first and second displacement cavities to the chamber, and having a pair of bleeder ports and a pair of bleeder port passages that fluidly couple the pair of bleeder ports to the first and second displacement cavities, first and second valves disposed in the passages between the first and second displacement cavities and the chamber, an annular pushrod coupled to the first and second valves, the annular pushrod having a pair of pawls that protrude from an inner surface of the annular pushrod, an axle disposed in the chamber, a motor gear disposed about the axle, the motor gear having a plurality of teeth that engage with the pawls on the pushrod; and first and second membranes disposed over first and second surfaces of the body, the first and second membranes covering the chamber, the first and second displacement cavities, the pair of bleeder ports and the pair of bleeder port passages, and with the first and second membranes each supporting a first set of electrodes over the first displacement cavity and a second set of electrodes over the second displacement cavity.

The above aspect may include amongst other features one or more of the following features:

The pneumatic driven motor translates the vertical motion of the first and second membranes using the displaced air into a linear reciprocating motion for rotating the motor gear in one direction. The electrodes are configured to receive electrical drive signals that cause flexure of the portions of the first and second membranes over the first and second displacement cavities. The flexure of the portions of the first and second membranes cause displacement of air from the first and second cavities and cause the pushrod to travel in a linear reciprocating motion, engaging teeth on the motor gear, causing the motor gear to rotate in one direction. The bleeder ports bleed air that may be trapped in a region between an outlet from each respective displacement cavity and the passage to the chamber.

According to an additional aspect, a method of producing a pneumatic driven motor includes patterning a sheet of material to provide from the sheet a frame having walls that define a chamber, a displacement cavity, a passage coupling the displacement cavity to the chamber, a bleeder port and a bleeder port passage coupling the bleeder port to the chamber, a valve in the passage between the displacement cavity and the chamber, and further defining within the chamber an annular pushrod having a pair of pawls, which is coupled to the valve, an axle, and a motor gear, adhering a first membrane over a first surface of the patterned sheet, with the first membrane carrying a first electrode on a portion of the first membrane that is disposed over the displacement cavity, and adhering a second membrane over a second, opposing surface of the patterned sheet, with the second membrane carrying a second electrode on a portion of the second membrane that is disposed over the displacement cavity.

The above aspect may include amongst other features one or more of the following features:

The method further includes patterning at least one of the first and second membranes to form corresponding annular apertures in regions of the at least one of the first and second membranes, which are over the axle, with the annular apertures defining central regions of the first and second membranes, which central regions of the first and second membranes are affixed to corresponding surfaces of the axle.

Each of the annular apertures are first annular apertures, and the method further includes patterning at least one of the first and second membranes to form a second annular aperture spaced from the first annular aperture. The method further includes forming a transfer layer that is coupled to the at least one of the first and second membranes, with the transfer layer configured to transfer rotation motion of the motor gear to an annular portion of the transfer layer. The method further includes disposing a gear mechanism over at least one of the first and second membranes adhered to the body, with a portion of the gear mechanism having an axle region that is coupled to the axle of the motor gear that transfers rotational motion of the motor gear to the gear mechanism.

The first and the second membrane each have conductive layers and the method further includes patterning the conductive layer on the first membrane to provide the first electrode and to provide a first conductor to make electrically contact to the first electrode and patterning the conductive layer on the second membrane to provide the second electrode and to provide a second conductor to make electrically contact to the second electrode.

One or more of the above aspects may include amongst other advantages one or more of the following advantages.

The pneumatic driven motor described below can be made using micro fabrication methods and can be used either as a high speed, low torque motor or a low speed high torque motor (depending on gearing arrangements) for a variety of industrial, medical, and biological applications. The pneumatic driven motor devices are fabricated using relatively inexpensive techniques. In particular embodiments, the pneumatic driven motor devices described below are synchronous motor devices and are fabricated using roll-to-roll manufacturing techniques.

The details of one or more embodiments of the invention are set forth in the accompanying drawings and the description below. Other features, objects, and advantages of the invention are apparent from the description and drawings, and from the claims.

DETAILED DESCRIPTION

Micro Electrostatic Actuated Pneumatic Driven Motor Overview

Micro electrostatic actuated pneumatic driven motors described herein are fabricated using inexpensive micro fabrication methods and can be used for conversion of electrical energy to mechanical energy in various industrial, commercial, medical, and biological applications. Micro electrostatic actuated pneumatic driven motors are fabricated on a micron/millimeter scale. Several fabrication techniques are disclosed.

A conventional synchronous, electrostatic motor type can be considered as a variable capacitor that rotates in response to an input, e.g., a square-wave voltage that is applied between stator and rotor plates. When the synchronous electrostatic motor rotates at a speed that is synchronous with respect to the applied square wave, the rotor turns half a revolution per cycle of the square wave.

In contrast, with a conventional asynchronous electrostatic motor type, the operation depends on an electric field that gives rise to induced charges on a surface causing the field to exert a torque on the surface. An asynchronous motor works by applying a DC voltage that induces a rotation of a rotor, with the rotation of the rotor causing electric charge changes. The electric charge changes cause movement that results in a continuous repetition of this electric charge change. The speed of the asynchronous motor is limited by friction and the load on the motor.

The micro electrostatic actuated pneumatic driven motor described below can be considered as a synchronous type of motor.

Figure 1:
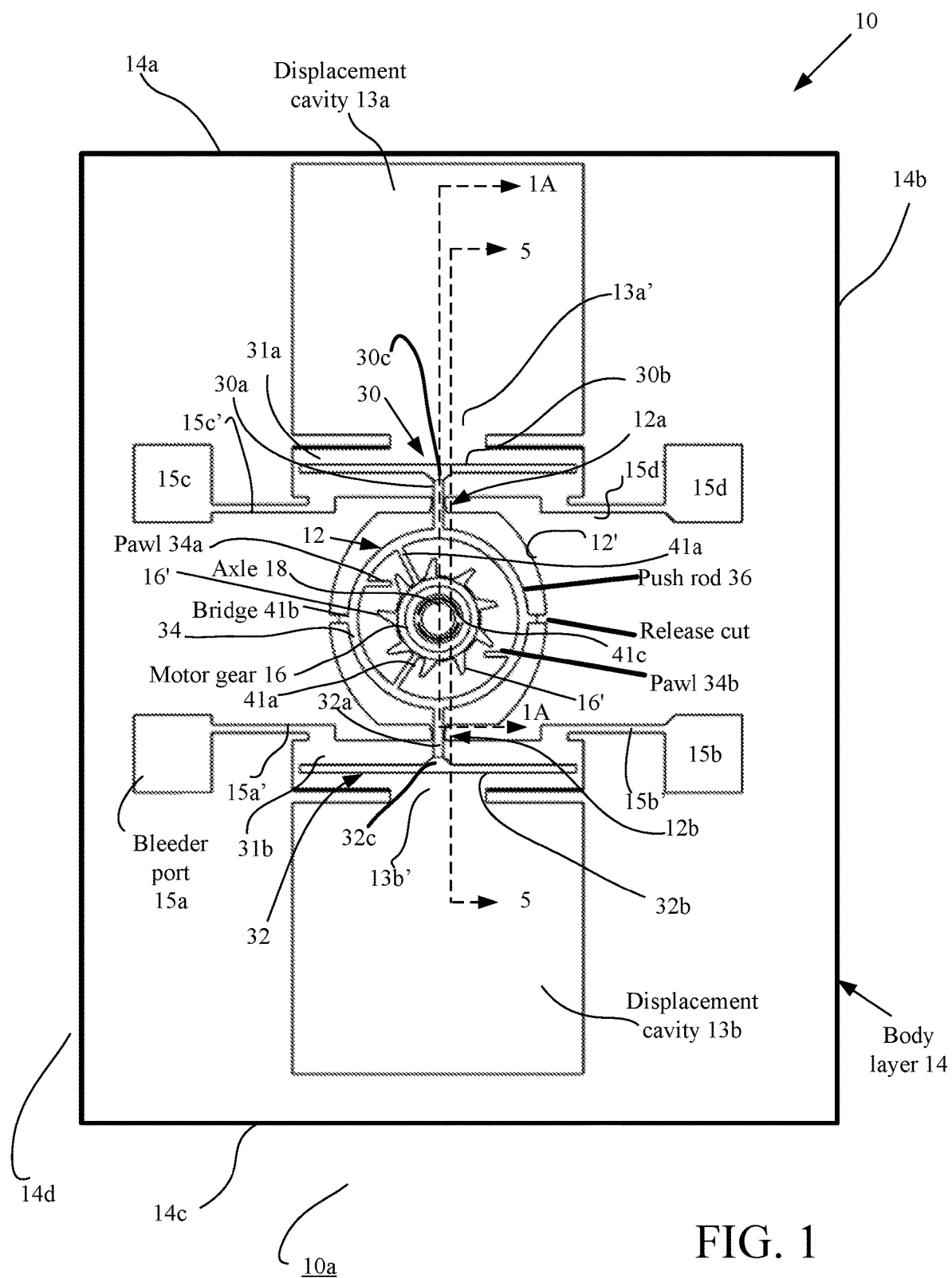
FIGS. 1-3 are plan views of micro electrostatic actuated pneumatic driven motor in stages of construction.

Referring to FIG. 1, a micro electrostatic actuated pneumatic driven motor device (hereinafter pneumatic driven motor) 10 in a stage of construction is shown. The pneumatic driven motor 10 includes a body layer 14 having plural external walls, e.g., four walls 14a-14d and an interior wall 12' that defines a chamber 12. FIG. 1 shows a front-side (or top side in subsequent figures) 10a of the pneumatic driven motor 10. The pneumatic driven motor can be fabricated, by, e.g., roll-to-roll processing (discussed below) and includes in addition to the chamber 12, a pair of displacement cavities 13a, 13b and two pairs of bleeder ports 15a-15d. The displacement cavities 13a, 13b have displacement cavity outlets 13a', 13b'.

The pneumatic driven motor 10 also includes a central rotatable motor gear 16 (motor gear 16) that is disposed in the chamber 12. The motor gear 16 is provided from the material of the body layer 14 and has plural motor gear teeth 16'. In this implementation, the motor gear 16 is disposed about a central axle 18 (a fixed member that does not rotate, but about which, the motor gear 16 rotates within the chamber 12). Details of axle 18 will be discussed in FIG. 1B.

A pair of passages 12a, 12b couple the chamber 12 to corresponding confinement chambers 31a, 31b adjacent to the displacement cavity outlets 13a', 13b' of the displacement cavities 13a, 13b. Each of the passages 12a, 12b confines sliding T shaped valve members 30, 32, respectively. Each sliding T shaped valve member 30, 32 (valves 30, 32) has a corresponding stem portion 30a, 32a, supporting a corresponding sail (i.e., a flat member portion) 30b, 32b. The stem portions 30a, 32a of the valves 30, 32 selectively travel in the respective passages 12a, 12b towards and away from the chamber 12, with sails 30b, 32b being confined by the corresponding confinement chambers 31a, 31b, in response to displacement of air through the outlets 13a', 13b' of the displacement cavities 13a, 13b. The confinement chambers 31a, 31b confine the sails 30b, 32b and hence the valves 30, 32 such that the respective stem portions 30a, 32a can slide back and forth but not out of the respective passages 12a, 12b.

The stem portions 30a, 30b have tapered base portions 30c, 32c at the intersection of the stem portions 30a, 32a and together with the sails 30b, 32b assist in positioning in the sails 30b, 32b, as the stem portions 30a, 30b travel within the passages 12a, 12b towards or way from the respective ones of the displacement cavities 13a, 13b.

Ends of stem portions 30a, 30b of the valves 30, 32 are coupled to a pushrod mechanism 36. The pushrod mechanism 36 includes a generally annular member 34 having a pair of pawls 34a, 34b that are positioned on opposing portions of the member 34. The pushrod mechanism 36 is provided about the motor gear 16.

As mentioned above, the pneumatic driven motor 10 includes bleeder ports 15a-15d. Each of the bleeder ports 15a-15d has a corresponding bleeder port passage 15a'-15d' that provide access to a volume of air behind the sails. In operation, one pair of the ports 15a, 15b acts as an inlet to a fluid flow and the other one of the pair of ports 15c, 15d acts as an outlet to fluid flow, e.g., air, with assignment of input vs. output to the ports determined according to displacement direction of the pushrod mechanism 36. In particular, the bleeder port passages 15a'-15d' allow air within the confinement chambers 31a, 31b to bleed out so as not to provide a force opposing travel of the respective valves 30, 32 that could impede movement of the pushrod mechanism 36.

The motor gear 16 carries teeth 16' that mechanically engage with the pair of pawls 34a, 34b that are positioned on opposing portions of the pushrod 36. The teeth 16' on the motor gear 16 are slanted relative to the circumference of the motor gear 16. The teeth 16' are also slightly tapered from the portion that is coupled to the motor gear 16 to the tip portion of the motor gear 16', such that for a given one of the teeth 16', that tooth 16' engages with one of the pawls 34a, 34b while the other one of the pawls 34b, 34a does not engage with any of the teeth over a full travel displacement of the pushrod assembly 36 in one direction and which corresponds to a half cycle displacement of the motor gear. The opposite pawl 34b, 34a does engage with a tooth 16' on the back half of the cycle, while the first pawl 34a, 34b disengages from its tooth 16' and remains disengaged from any tooth during this half of the cycle.

Therefore, a full travel for a half cycle has the pushrod 36 causing one of the sails 30b, 32b on one of the valves 30, 32 to move in sufficient proximity to and/or to rest against walls (not referenced) of the corresponding confinement chamber 31a, 31b.

On the other hand, a full travel for a complete cycle has the pushrod 36 causing one of the sails 30b, 32b on one of the valves 30, 32 to move in sufficient proximity to and/or to rest against walls (not referenced) of the corresponding confinement chamber 31a, 31b for a first half cycle followed by the pushrod 36 causing the other one of the sails 32b, 30b on the other one of the valves 32, 30 to move in sufficient proximity to and/or to rest against walls (not referenced) of the other one of the corresponding confinement chambers 31b, 31a. A full cycle (of a drive signal) is required to advance the motor gear one tooth position or 1/n of a revolution of the motor gear 16. The pushrod 36 travels from an extreme position to the opposite extreme position and back to complete a full 1/n cycle. That is, a full cycle has a full travel of the pushrod 36 from one extreme to the other and back to the starting position.

"Sufficient proximity" depends on the particular geometric features of the valves (e. g., length of the stem portions 30a, 32a) relative to the positioning of the teeth 16' and the pawls 34a, 34b and length of the passages 12a, 12b, etc. In some configurations, the sail portions 30b, 32b rest against walls (not referenced) of the confinement chambers 31a, 31b, but in other implementations the budges 30c, 32c may make contact with the openings in the passages 12a, 12b before the sails can actually contact the walls of the confinement chambers 31a, 31b. Other arrangements may be possible.

Also shown are a pair of bridge members 41a that couple the motor gear 16 to the pushrod 36 and a pair of bridge members 41b that couple to the annular member 34, which is part of the pushrod 36, to the body 16. These bridge members 41a, 41b are temporary structures used to hold the motor gear 16 and the pushrod 36 in place during initial stages of fabrication. The bridge members 41a, 41b are patterned from the body 14. Bridges 41c (only one labeled) tether the axle 18 to the motor gear 16.

Figure 1B:
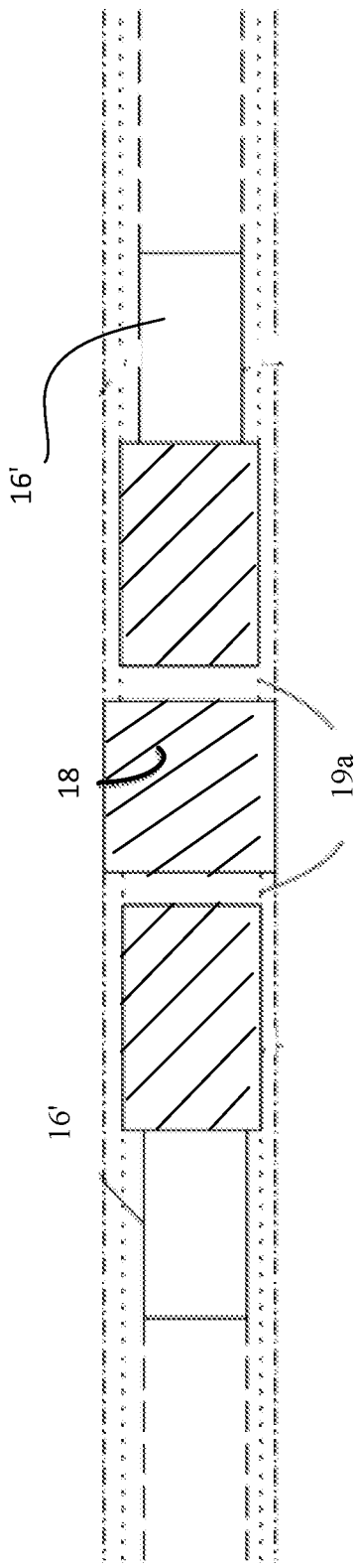
FIG. 1B is an enlarged, cross-sectional view taken about region 1B of FIG. 1A.
Figure 1A:
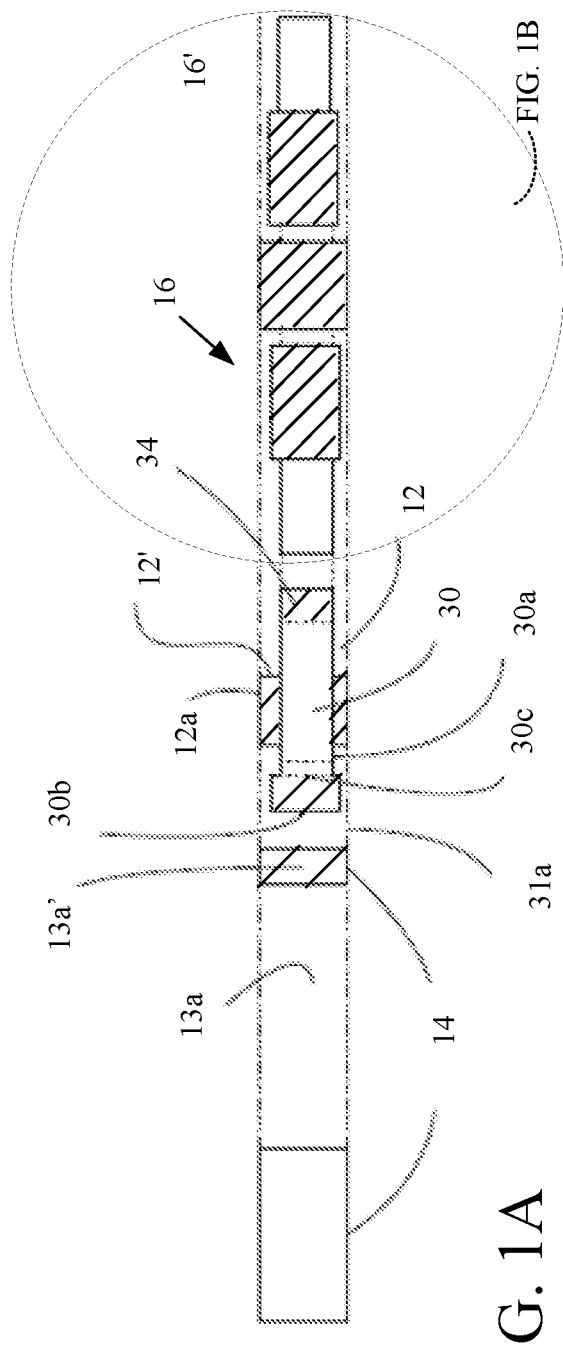
FIG. 1A is a cross-sectional view taken along line 1A-1A of FIG. 1.

FIG. 1A shows elements (all of which are provided in body 14) of the pneumatic driven motor 10. Shown in cross-section are the motor gear 16 within the chamber 12. Shown, as not being in the cross-sectional view of FIG. 1A are two teeth 16', as well as the displacement chambers 13a, 13b and the confinement chambers 31a, 31b. Also shown are the axle 18 disposed about the motor gear 16 and the annular member 34.

FIG. 1B is an enlarged view of a portion of FIG. 1A and shows the elements of the motor gear 16 including the axle portion 18, teeth 16' (not in the cross-section) and the axle 18 disposed about the motor gear 16 and spaced from the motor gear 16 and by the annular gap 19a.

Figure 2:
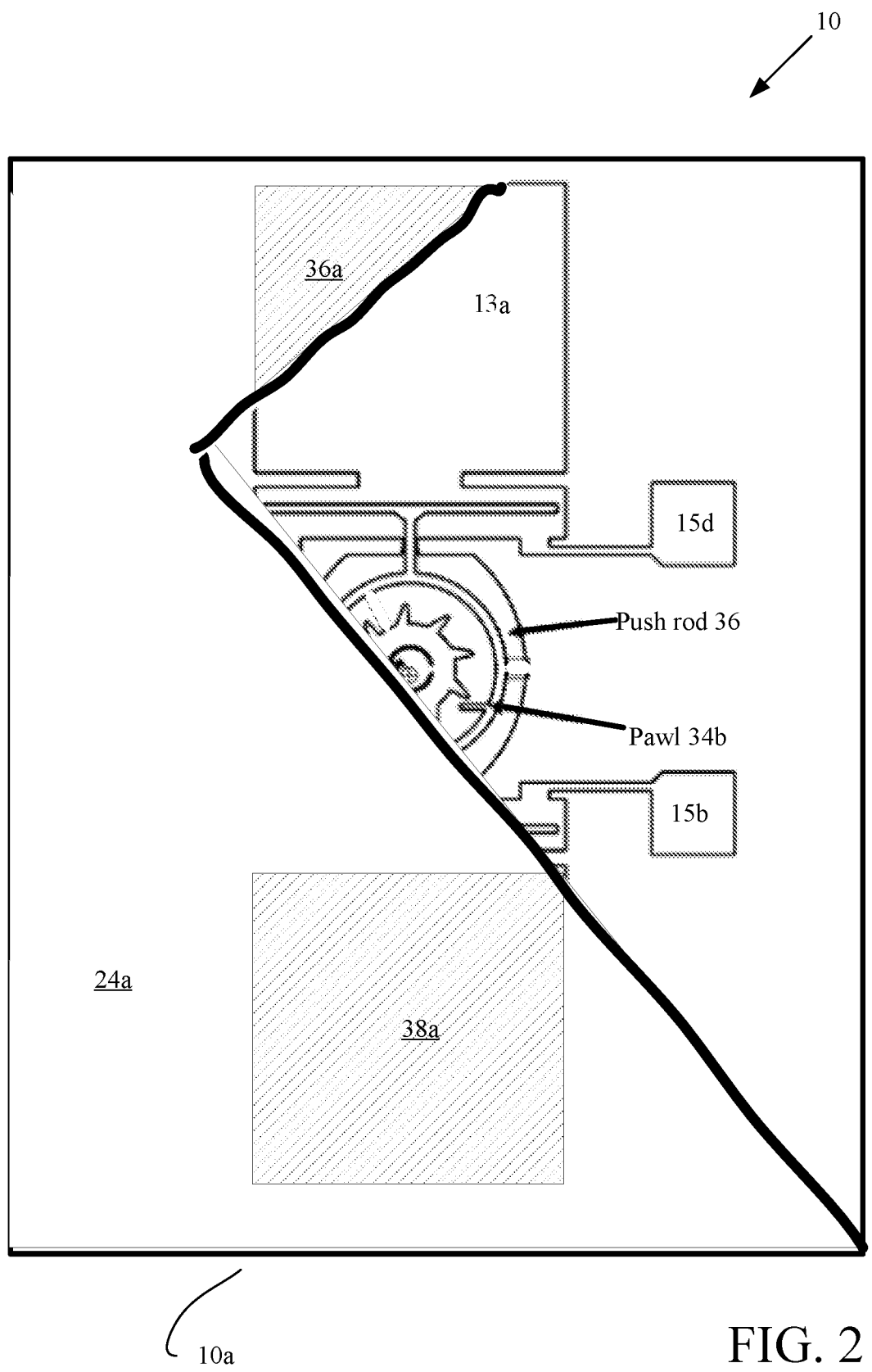

Referring now to FIG. 2, a front-side view 10a of the assembly of FIG. 1 is shown with the bridge members 41a and 41b (FIG. 1) removed, leaving the motor gear 16 and the axle 18. (All bridges are removed at a subsequent stage of fabrication but are shown removed here for clarity). Also shown in FIG. 2 is a first membrane layer 24a disposed over the front side 10a of the pneumatic driven motor 10, which supports a metallized surface (not shown) that is patterned to form electrodes 36a and 38a in alignment over the displacement cavities 13a, 13b. The bridge members (not shown) were used to tether the gear 16, the axle 18, and the pushrod 36. A release cut process isolates the pushrod 36 from the body 14, the motor gear 16 from the pushrod 36, and the axle 18 from the motor gear 16. Also shown are two of the bleeder ports 15b, 15d.

Figure 3:
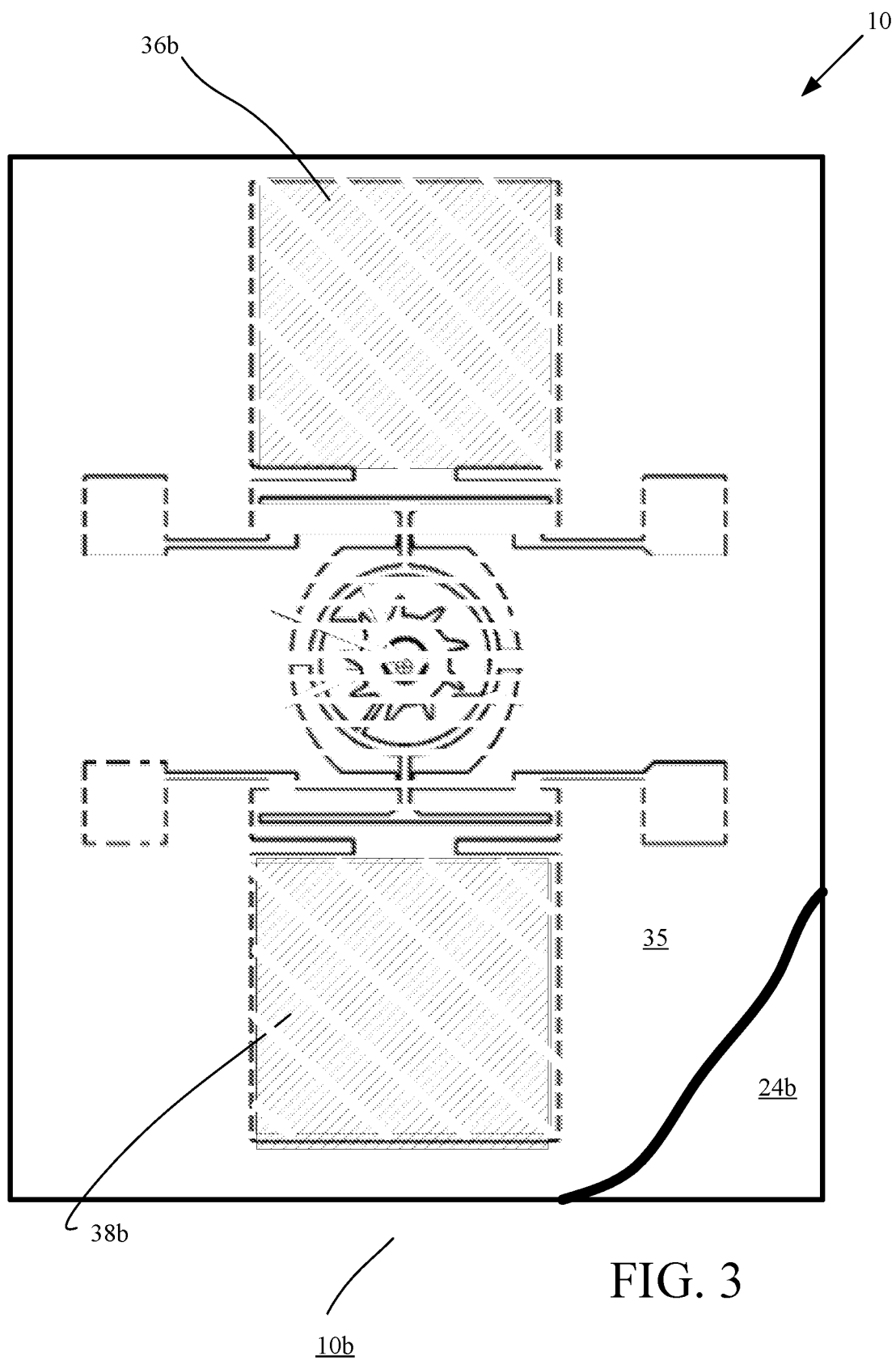
Figure 4:
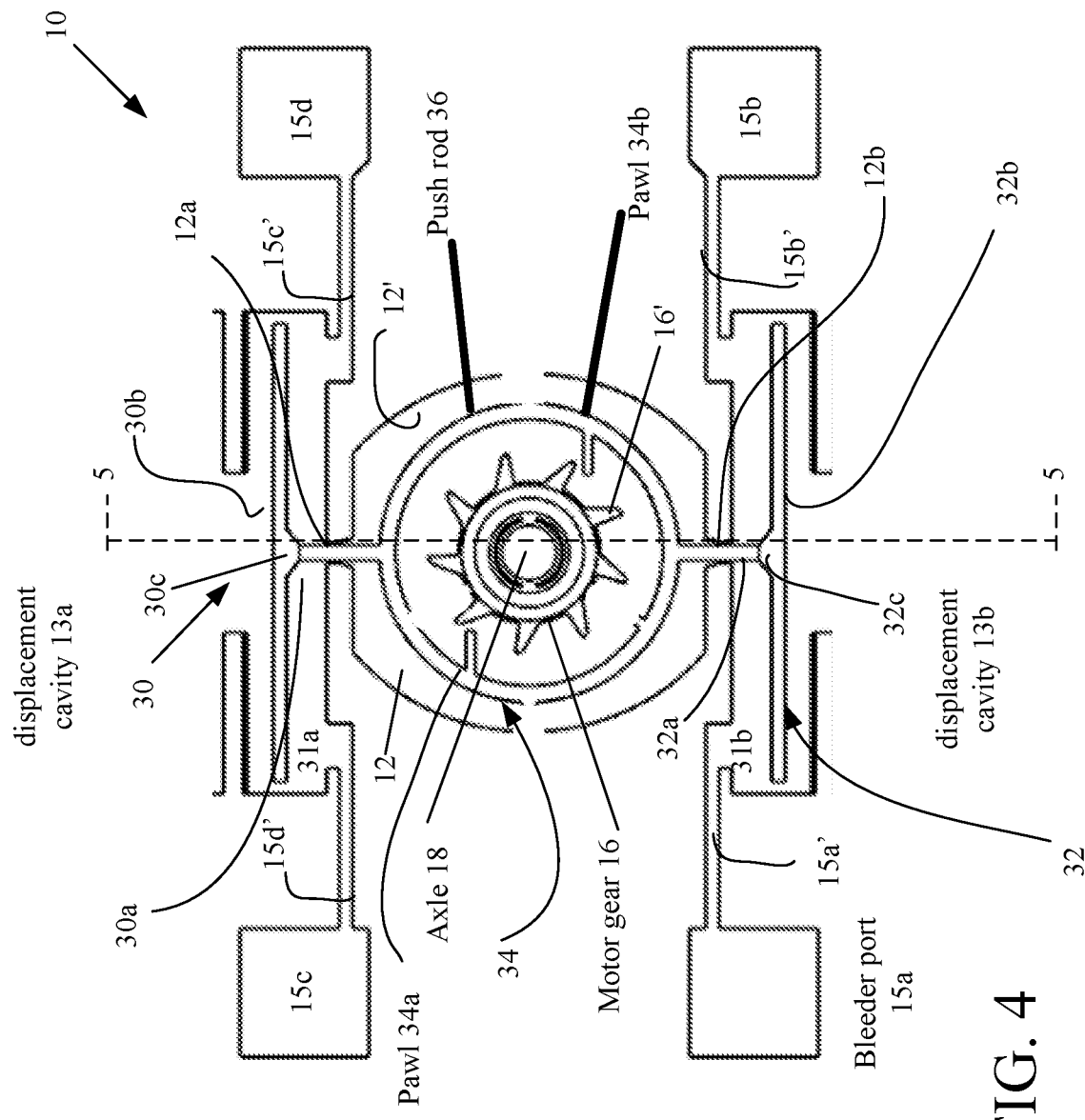
FIG. 4 is a somewhat enlarged view of the micro electrostatic actuated pneumatic driven motor at the stage of construction of FIG. 3 with upper layer removed and which shows details of a pushrod mechanism.

Referring now to FIG. 3, a backside 10b of the pneumatic driven motor 10 in a subsequent stage of fabrication is shown. The pneumatic driven motor 10 further includes another body layer 35 supporting a second membrane layer 24b. The second membrane layer 24b supports a pair of electrodes 36b, 38b provided from a metallized layer (not referenced) that is patterned to form the electrodes 36b and 38b. Not shown in FIG. 2 or 3, but which would be included, are conductors that couple the electrodes 36a, 36b and 38a, 38b to a drive source. Referring now to FIG. 4, details of the pushrod mechanism 36 of the pneumatic driven motor 10 are shown with the bridges removed and release cuts made. Valves 30, 32 are shown with the stem portions 30a, 32a confined within the passages 12a, 12b with sails 30b, 32b attached to the stem portions 30a, 32a.

Also shown are the confinement chambers 31a, 31b that are coupled to the chamber 12 by the passages 12a, 12b and that are coupled to the bleeder ports 15a-15d via passages 15a'-15d'. The valves 30, 32 have the tapers 30c, 32c and the sail portions 30b, 32b attached to the stem portions 30a, 32a. The stem portions 30a, 30b slide within the passages 12a, 12b between the chamber 12 and the respective displacement cavities 13a, 13b, which sliding opens and closes the respective valves 30, 32. The passages 12a, 12b are sized such that the stem portions 30a, 32a can freely travel within the passages 12a, 12b. FIG. 4 also shows the pawls 34a, 34b on the annular member 34, which are part of the pushrod 36 arrangement, and which engage with teeth 16' on motor gear 16. Also shown in detail are passages e.g., 15a'-15d' that couple bleeder ports 15a-15d to the confinement chambers 31a, 31b.

Pneumatic Driven Motor Operation

This initial discussion of the pneumatic driven motor 10 will explain certain details and principles of operation of the pneumatic driven motor 10. The pneumatic driven motor 10 is a synchronous type. Displacement is caused by air (or another gas) being displaced from one of the displacement cavities 13a, 13b that pushes one of the T valves 30, 32 closed (while opening the other one of the T valves 32, 30), and therefore causing reciprocating displacement of the pushrod 36. This reciprocating displacement or motion of the pushrod 36 provides reciprocating engagement of the teeth 16' with the respective pawls 30a, 34b.

That is, for a displacement of the pushrod 36 upwards (as viewed in FIG. 1), one of the teeth 16' on the motor gear 16 adjacent to pawl 34b will mechanically engage with and push against that tooth 16', until the pawl 34b disengages with that tooth at the tip of the tooth 16', which occurs when upward motion stops. The tooth at the tip is slanted relative to the circumference of the motor gear 16 at the base. While pawl 34b engages one of the teeth 16', the other pawl 34a is not in contact with and thus does not mechanically engage with any of the teeth 16'.

However, for a displacement of the pushrod 36 downwards (as viewed in FIG. 1), one of the teeth 16' on the motor gear 16 adjacent to pawl 34a mechanically engages with and pushes against that tooth 16' and until the pawl 34a disengages that tooth 16' at the tip, which occurs when downward motion stops. The tooth at the tip is slanted relative to the circumference of the motor gear 16 at the base. While pawl 34a engages one of the teeth 16', the other pawl 34b is not in contact with and thus does not mechanically engage with any of the teeth 16'.

This reciprocating displacement or motion of the pushrod 36 provides reciprocating engagement of the teeth 16' with the respective pawls 34a, 34b and corresponding rotation of the motor gear 16, with each full displacement cycle of the pushrod 36 causing the motor gear 16 to rotate a fraction of a revolution defined as 1/n where n is the number of teeth on the motor gear 16. One example for the number of teeth "n" is nine (9) teeth, although other numbers of teeth could be used. As illustrated in the figures the pawls 34a, 34b and the teeth 16' of the motor gear 16 are arranged in specific locations such that the pushrod 36 causes rotation of the motor gear 16 in a counter-clockwise direction. A clock-wise direction could alternatively be configured as well.

The motor gear 16 rotates about the axle 18. In the axle implementation, the motor gear 16 is physically isolated from the axle 18 by a relatively small gap 19a that is devoid of the material used to form the motor gear 16. By relatively small gap is meant that the gap is of a size sufficient to allow the motor gear to be mechanically isolated from the axle 18 and yet remain stable about its rotation around the axle 18, as the axle 18 remains fixed, e.g., stationary.

Referring back to FIGS. 1-3, the electrodes 36a and 38a and electrodes 36b, 38b are disposed over top and bottom surfaces of the corresponding displacement cavities 13a, 13b. The electrodes 36a and 38a are supported on top of the membrane 24a and electrodes 36b, 38b are supported on top of the membrane 24b.

The pneumatic driven motor 10 is driven by applying voltage potentials across electrode pair 36a and 36b and electrode pair 38a, 38b. The applied voltage potentials cause the membrane layers 24a, 24b to flex either towards each other (by applying opposite charges on the corresponding electrode pair) or to repel away from each other (by applying like charges on the corresponding electrode pair).

During a first half cycle, when the membrane layers 24a 24b flex towards each other that flexing displaces air from the corresponding cavity 13a, 13b. Displacing air pushes on the sail portion 30b, 32b of the corresponding valve 30, 32 in the corresponding confinement chamber 31a, 31b, which pushes the pushrod 36 (forward). Simultaneously, when the membrane layers 24b, 24a flex away each other that flexing causes air to be drawn into the corresponding cavity 13b, 13a. Drawing in air pulls the corresponding valve 30, 32 in the corresponding confinement chamber 31a, 31b to pull the pushrod 36 (backward).

During a second half cycle, the polarities of the applied voltage potentials are reversed and the actions of the valves 30, 32, and pushrod 36 are also reversed. Thus, the applied voltage potentials alternate in polarities and alternately push and pull the pushrod 36 to form a reciprocating motion that causes the corresponding pawl 34a or 34b to engage with a tooth 16' on the motor gear 16 to turn the motor gear 16 by one fraction (1/n) of a revolution for each full cycle of applied voltage potential.

Electrostatic Actuation

The pneumatic driven motor 10 is a synchronous motor. That is, there exists a relationship between the number of revolutions per minute (RPM) and drive signal. The pneumatic driven motor 10 is implemented on the micrometer to millimeter scale using techniques disclosed herein. While the pneumatic driven motor 10 is electrostatically actuated, it is pneumatically driven. The pneumatic driven motor 10 translates vertical motion of a set of membranes (e. g. 24a, 24b) using displaced air, into a linear motion that is capable of rotating the toothed motor gear 16 in one direction. The pneumatic driven motor 10 has a defined relationship between assertion of a drive signal frequency and advancement of the toothed motor gear 16, thus providing a motor 10 that is synchronous.

Figure 4A:
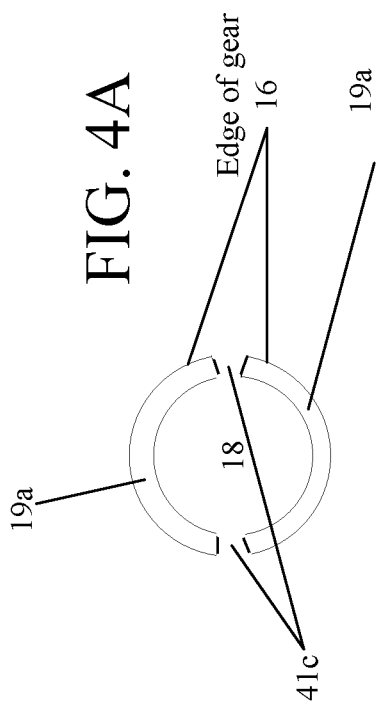
FIG. 4A is an enlarged view of a portion of an axle used in FIG. 4.

FIG. 4A is shown in an enlarged view of a portion of the axle 18 to delineate the tethers 41c that tether the axle 18 to the edge of the gear 16 across the gap 19a.

Figure 4B:
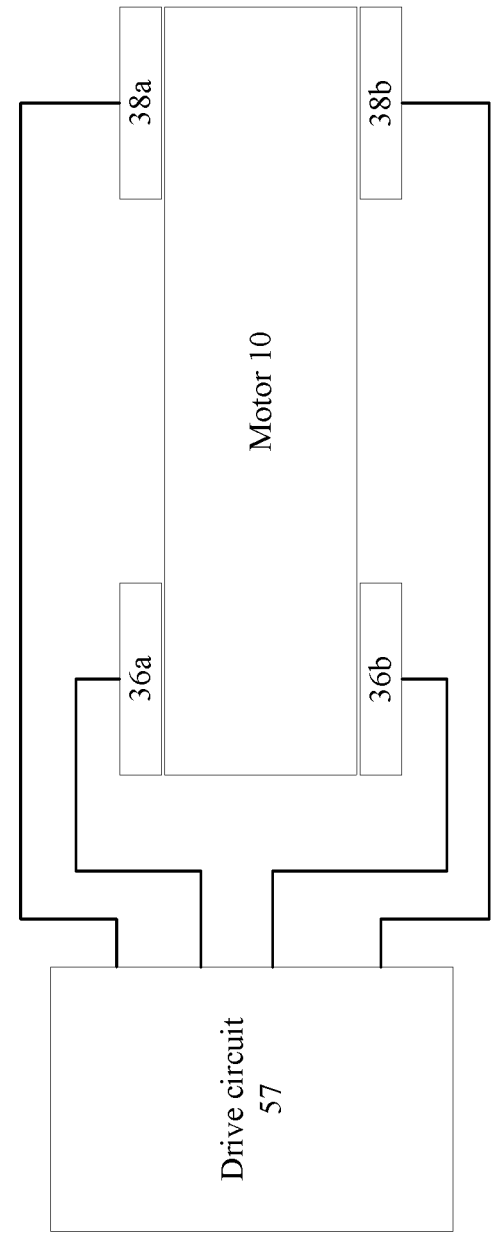
FIG. 4B is a schematic view of the pneumatic driven motor coupled to a drive circuit.

Referring to FIG. 4B, to activate the pneumatic driven motor 10, a drive circuit 57 provides two different electrical drive signal phases that are applied to at least one electrode pair over at least one displacement cavity 13a, 13b (not shown).

While FIGS. 1-3 show two displacement cavities 13a, 13b and two pairs of electrodes 36a, 36b and 38a, 38b supported on membranes 24a, 24b, respectively, it is feasible that only one displacement cavity, e.g., 13a having the pair of electrodes 36a and 36b supported on membranes 24a, 24b could be used. In the discussion below, a single displacement cavity 13a, e.g., is used as the active drive mechanism.

Figure 4C:
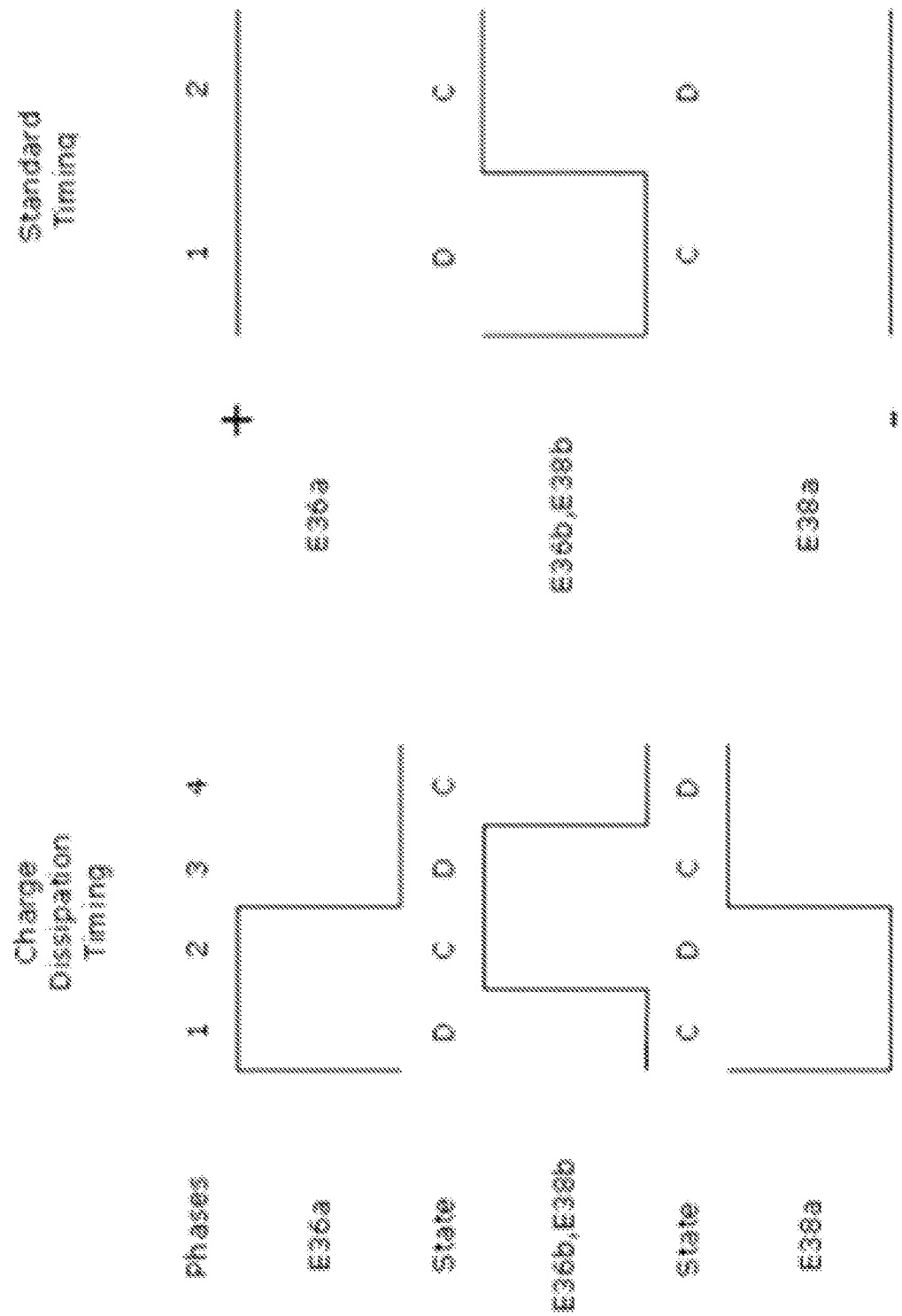
FIG. 4C is a timing diagram.

FIG. 4C shows two different drive signal mechanisms. One mechanism has four distinct phase relationships among three signals that are square wave, phase staggered signals that provide what is referred to herein as "charge dissipation timing" or "(CDT)." These signals are applied to the electrodes 36a, 36b, 38a and 38b, as shown. The other mechanism is a more standard type of timing in which two of the signals are fixed and are applied to the electrodes 36a, 38a, as shown (one plus charge the other minus) with a third signal being a square wave applied to electrodes 36b, 38b.

In some implementations, charge may build up on electrodes using the standard timing mechanism, whereas the "charge dissipation timing" or "(CDT)," dissipates charge, obviating the potential for charge buildup to some degree.

Single Displacement Cavity Operation

While, the pneumatic driven motor 10 is shown and described as having two displacement cavities 13a and 13b, the pneumatic driven motor 10 need only have one displacement cavity.

Consider that the pneumatic driven motor 10 has only displacement cavity 13a (and corresponding confinement chamber 31a and other features, but not displacement cavity 13b or confinement chamber 31b), but the pneumatic driven motor 10 will have the channel 12b to support that end of the pushrod 36. The two electrodes 36a, 36b supported on the membranes 24a, 24b are actively driven towards each other by attraction (by applying signals of opposite charge) for a first drive signal phase, and separated initially either by repulsion (like charges) for a second drive signal (second phase of the drive signals), or initially by repulsion but then predominantly by elastic rebound of the membranes 36a, 36b in a predominately passive manner or solely by elastic rebound of the membranes. As the membranes 24a, 24b come together, air between the membranes in the displacement cavity 13a is discharged onto the sail and pushes the sail away. As the volume behind the sail feature is reduced in the confinement chamber 31a, the air there is pushed out of the bleeder ports 15c, 15d. When the membranes 24a, 24b come apart, air is sucked back into the displacement cavity 13a and the cavity is charged with air. The bleeder ports prevent an "air lock" condition that could impede the movement of the pushrod 36. This discharge/charge cycle repeats as long as there are active drive signals. This air is directed to the faces of sail portions 30b, 32b of the valves 30, 32.

The pneumatic driven motor 10 is shown in FIG. 1, and described as having two displacement cavities 13a and 13b. Thus, another variation is to have two displacement cavities 13a, 13b, but having only one of the two displacement cavities 13a, 13b being actively driven. In this configuration, the displacement cavity 13a is actively driven, whereas the displacement cavity 13b is passively driven (elastic flexing of the membranes 24a, 24b).

Another variation is provided by stacking motor layers in a "double membrane" configuration where there is attraction in both directions alternating with signal phase (not at the same time). The two electrodes 36a, 36b supported on the membranes 24a, 24b are actively driven towards each other by applying signals of opposite charge for a first drive signal phase, and separated initially by repulsion like charges for a second drive signal while the membranes 24a, 24b over the second displacement cavity 13b flex (due to elastic properties) are opposite to that of cavity 13a due to alternate discharge and charging of air from/to the first displacement cavity 13a.

However, as shown in FIGS. 1-4, the motor 10 has the two displacement cavities 13a and 13b with the additional electrode pair 38a, 38b over the other displacement cavity 13b. In this arrangement of driving both cavities 13a, 13b, the arrangement provides actively driven attraction and repelling motions. The drive signals applied to the two electrodes 36a, 36b over displacement cavity 13a are opposite in phase to that of the drive signals applied to the two electrodes 38a, 38b over displacement cavity 13b.

FIG. 4C shows an exemplary set of drive signals where "+" is positive charge and "−" is negative charge. Thus, when a first set of drive signals are applied to the electrodes 36a, 36b over displacement cavity 13a those drive signals cause the membranes 24a, 24b to be actively driven towards each other by attraction (by applying signals of opposite charge), while at the same time, a second set of drive signals are applied to the electrodes 38a, 38b over displacement cavity 13b. Those drive signals cause the membranes 24a, 24b to be actively repelled from each other by repulsion (by applying signals of like charges) in addition to elastic rebound of the membranes 24a, 24b. Elastic rebound is the predominate mechanism. This push-pull arrangement resulting from adding the second driven displacement cavity 13b opposing the first displacement cavity, can achieve a faster rate of charging and discharging of air from the cavities allowing for operation at higher RPM' s, instead of relying on elastic rebound alone.

As the membranes come together in one of the cavities 13a, 13b, air between the membranes 24a, 24b over, e.g., the displacement cavity 13a is discharged pushing on one end of the pushrod 36, and the pushrod 36 is further pulled by a sucking motion caused by repulsion of the membranes over the other cavity 13b, because when the membranes 24a, 24b come apart, air is sucked back into that displacement cavity 13b and that displacement cavity 13b is charged with air. This discharge/charge cycle repeats as long as there are active drive signals. This air is directed to a sail of one of the valves 30, 32 attached to the pushrod 36.

Pneumatic Actuation results from the membranes 24a, 34b either coming together or repelling each other repeats as long as there are active drive signals. Air impinging on the face (sail) portions 30b, 32b of the valves 30, 32 pushes the pushrod 36, which engages one of the pawls with one of the teeth 16' on the motor gear 16, for each full displacement of the pushrod 36. When the air is discharged, it applies force to the pushrod 36, which pushes the pushrod 36 away. That is, as one side moves nearer to the motor gear 16 the other side moves further away from the motor gear 16. When the air is charging, the pushrod 36 is drawn back to its starting position. The bleeder ports 15a-15d on either side of the pushrod 36 help avoid an airlock condition, which can impede pushrod motion.

The motor drive mechanism includes the pushrod 36 that has a back and forth (reciprocating) direction of travel over a specific length. Integrated as part of the pushrod 36 are the two pawls 34a, 34b that are responsible for engaging and pushing the teeth 16' on the motor gear 16. The pawls 34a, 34b are arranged on either side of the motor gear 16 in specific locations such that as the pushrod 36 moves in a first direction, one of the pawls 34a, 34b hits a tooth 16' and moves the motor gear 16 one half of a tooth position counter-clockwise, while the other pawl 34b, 34a is disengaged or isolated from the motor gear 16. When the pushrod moves back in a reverse direction, the other pawl 34b, 34a hits a tooth and moves the motor gear 16 one half of a tooth position, again, in the same counter-clockwise direction while the first pawl 34a, 34b is disengaged or isolated from the gear 16. Together, these two half position advances provide a 1/n movement of the motor gear 16 due to the full travel and full cycle of the pushrod 36. An engagement with a single tooth moves the motor gear 16 a movement of ½n. This mechanism converts a reciprocating (back and forth) motion into a rotational motion in a single rotation direction.

The motor gear 16 has nine teeth and is dimensioned specifically to work with the pawls 34a, 34b on the pushrod 36. The motor gear 16 is fabricated to turn freely around its axle 18, once released, with minimum friction. A shoulder detail 21a helps to minimize surface contact, whereas a collar detail 21b is used for connecting to adjacent layers (see FIG. 7). The motor gear 16 is configured to connect to, e.g., a gear mechanism on a layer above the motor 10 (FIG. 8B). This mechanism, mentioned briefly below, allows for the transfer of the motor's rotational motion to another gear that is part of a gear train.

Axle—The axle is stationary and fixed to a pair of membranes that are below and above the axle. When the pneumatic driven motor 10 is being coupled to a gearing system, its axle is also coupled to an axle on another layer.

To achieve full displacement of the air inside of the displacement cavity requires sufficient magnitude of drive voltages to overcome back pressure (resistance to movement). Insufficient displacement of the air produces less force on the pushrod and therefore less travel. When the pushrod is being pushed by the discharged air, the air on the other side of the sail (the backside) is also being displaced. So, there are two channels for escape of air, to reduce any pressure buildup that might push back on the pushrod and therefore limit its travel.

Conversely, when the displacement volume is charging, it is "sucking" or pulling the pushrod 36 back. The air flow on the backside of the sail should be sufficient so as to avoid producing a vacuum that would otherwise hold the pushrod back and limit its return travel.

The pushrod 36 movement has a minimum stroke length (close to full travel) in order to operate the pneumatic driven motor 10 synchronously; one tooth advance per cycle of drive. This is because a first pawl pushes a first tooth sufficiently forward in order to place a corresponding second tooth in position for the second pawl to catch the corresponding second tooth on the pushrod's return travel. If the pushrod's travel is limited, the pushrod 36 might not push the second tooth far enough to be captured by the other second pawl.

Motor Gear Rotation

The illustrated and described pneumatically driven motor 10 is configured to rotate counterclockwise. However, clockwise rotation could be achieved by reversing the positioning of the pawls and the slanting of the teeth on the motor gear. The pushrod and pawl mechanisms convert a reciprocating motion into a rotational motion if there is sufficient length of travel (full travel) of the pushrod 36. While the tolerance between the axle 18 and the surface area of the motor gear 16 in contact with its surroundings are sources of friction, and can limit the availability of the motor's energy that is applied to a load, the processing sequence and the device geometry described herein can minimize these sources of loss.

Synchronous operation provides a relationship between revolutions and drive signal. Synchronous operation can be shown by counting revolutions and comparing to the drive signal frequency.

Revolutions Per Minute—The pneumatic driven motor 10 has a nine-tooth motor gear 16. When properly configured, the motor gear 16 advances one tooth per drive signal cycle. So, RPM can be calculated to be equal to the drive signal frequency in hertz divided by nine (the number of teeth) times sixty (number of seconds in a minute).

Torque—The implementation of a pneumatic driven motor 10 at this scale produces a pneumatic driven motor 10 capable of high RPM, but at low torque. In order to make the pneumatic driven motor 10 more useful, a gear train can be added to divide down the RPM and therefore multiply up the torque. Such a gear train is briefly discussed below. Each application will dictate the power requirement of such a pneumatic driven motor 10 system and, therefore, the number of pneumatic driven motor 10 layers needed and the associated gearing.

Axle Implementation

Figure 5:
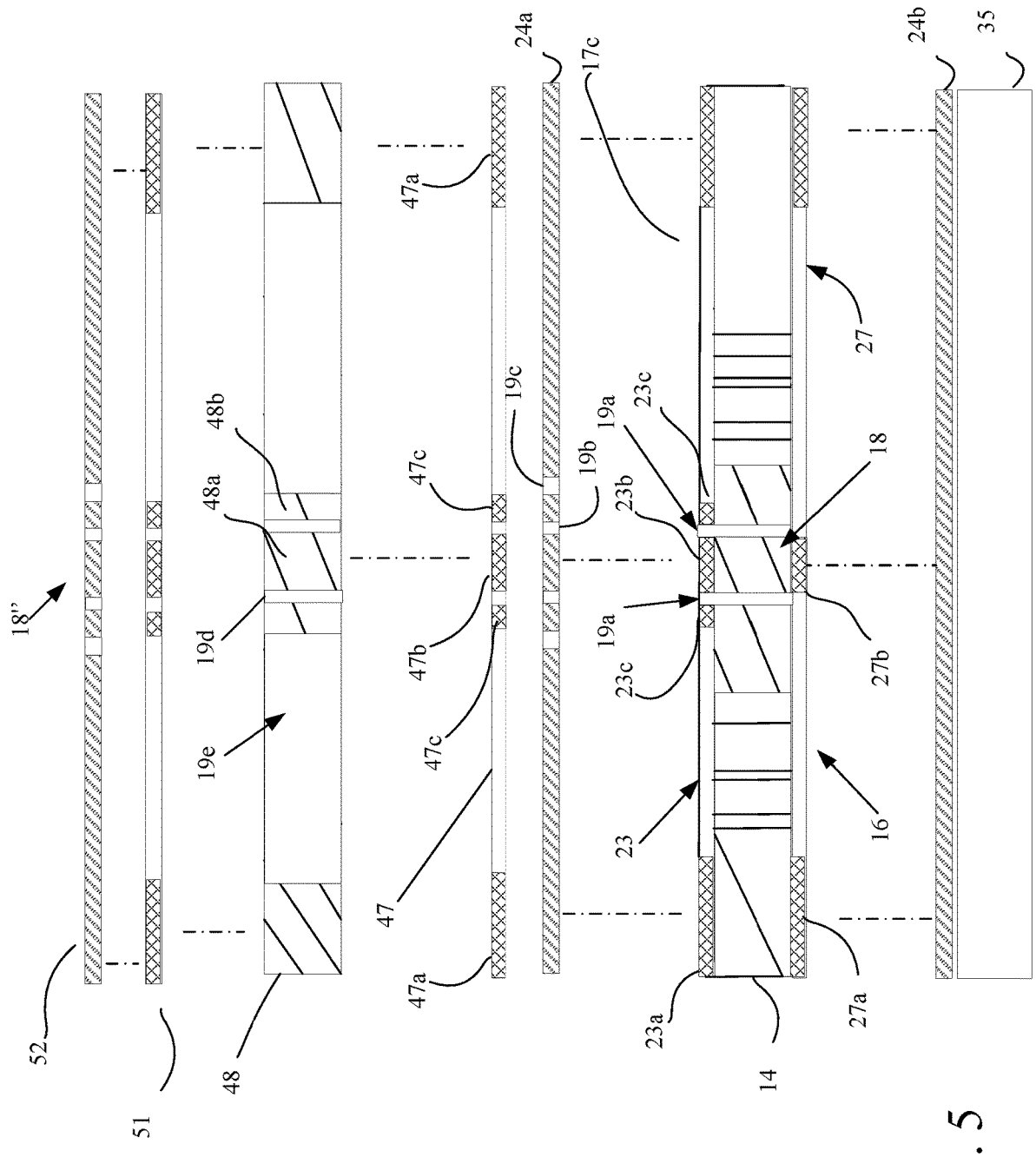
FIG. 5 is a cross-sectional view taken along line 5-5 of FIG. 4, showing details of axle fabrication.

Referring now to FIG. 5, the axle implementation of the pneumatic driven motor 10 is shown as including a pair of repeatable composite layers (repeatable layers). A first repeatable layer includes the patterned body layer 14 that has inter alia., the motor gear 16 and the axle 18 physically spaced via gap 19a from the motor gear 16 (as shown in FIGS. 1-4) and over, which is the membrane 24a. A second repeatable layer includes the body layer 35 supporting the second membrane layer 24b having the pair of electrodes 36b, 38b, with the second membrane 24b attached to the bottom of the body layer 14. This provides a minimal construction of the pneumatic driven motor 10 as including the first and second repeatable layers and a third repeatable layer of a body layer 48 and membrane 52. Each of layers 35 and 48 are patterned to have voids aligned with the positions of the displacement cavities 13a, 13b in layer 14, and yet have solid regions aligned with the positions of the corresponding confinement chambers 31a, 31b.

In FIG. 5, body layer 48 is a motion transfer layer (or transfer layer) that transfers gear rotation to either a gear train mechanism (FIGS. 6A and 8A, 8B) or allows access to the rotation caused by the motor gear 16 on a top surface of the membrane 52, as shown. In this latter implementation, an adhesive layer 51 similar to a layer that provides adhesive regions 47a-47c is provided over body 48 to attach the membrane 52 that is similar in patterning to membrane layer 24a.

As an example, a first adhesive layer 23 on the body 14 is patterned leaving first regions 23a of adhesive on the top surfaces that will correspond to the walls of the body 14, a second region 23b of adhesive on the top surfaces that will correspond to the axle 18, and a third adhesive region 23c that is an annular region of adhesive spaced from the second region 23b of adhesive material. Subsequent to patterning of the adhesive layer 23 the features in the body 14 are provided, e.g., the motor gear 16, valves 30, 32, passages 12a, 12b, chamber 12, pushrod 36, displacement cavities 13a, 13b, etc.

The membrane layer 24a is disposed over the whole body 14. The membrane layer 24a adheres in the regions having the adhesive material 23a-23c, i.e., to the top surfaces of the walls of the body 14, the axle 18 (due to the second region 23b of adhesive material) and in the third region 18c the annular region of adhesive material.

A second adhesive layer 27 is patterned leaving first regions 27a of adhesive on the bottom surfaces of the body 14, a second region 27b of adhesive on the axle 18. The membrane layer 24b is disposed under the adhesive regions 27a-27b. The membrane layer 24b adheres in the regions having the adhesive material, i.e., to the bottom surfaces of the walls of the body 14, the axle 18 (due to the second region 27b of adhesive material).

Other portions of the membranes 24a, 24b may be in contact with, but do not adhere to other portions of the pneumatic driven motor 10 or preferably are spaced from the features, e.g., the gear 16 and pushrod 36, valves 30 and 32, and are thus free to rotate or move, but which are confined between the membranes 24a and 24b.

FIG. 5 also shows that the membrane layer 24a is patterned leaving a first annular void 19b aligned with the gap 19a between the region 23b and the region 23c of adhesive material (of the body layer 14). The membrane layer 24a is further patterned leaving a second annular void 19c spaced from the annular gap 19b, as shown. The first annular void 19b is disposed about the portion of the membrane 24a that adheres to the axle 18 via the adhesive region 23b (of the body member 14).

Another patterned adhesive layer 47 is shown as patterned over the membrane 24a. This adhesive layer would typically be provided on body layer 48 and would adhere the body layer 48 to the membrane 24a. This adhesive layer is patterned leaving the regions 47a generally aligned with walls of the body 14, the annular region 47c aligned with annular region 23c about the gap 19a (on layer 14) and a central region 47b of adhesive material aligned with the region 23b (on layer 14). The membrane layer 24a with the body layer 14 and the adhesive regions 47a-47c can accept further structures such as a gear train, discussed below.

This construction, as shown, provides an axle implementation in which the axle 18 is fixed and the motor gear 16 rotates about the axle 18. Rotational motion is carried to, e.g., upper layers of the motor 10, by the region of the membrane 24a underlying adhesive region 47c that connects to the motion transfer layer 48 by way of adhesive regions 23c and 47c. The first annular void 19b is disposed about the portion of the membrane 24a adhered to the axle 18, via the adhesive region 23b (of the body member 14).

The body layer 48 adheres to the patterned membrane 24a, via the adhesive regions 47a, 47c. The body layer 48 is patterned to leave body walls (not referenced), a central portion 48a, spaced by a gap 19d, from an annular member portion 48b of the body layer 48, and the annular member portion 48b spaced from the body walls (not referenced), by an annular void 19e. Because the axle 18 is physically spaced from the gear 16, and yet the axle 18 is adhered to, i.e., affixed to the membrane 24a (and the corresponding backside membrane 24b), the axle 18 will not rotate, as motor gear 16 rotates. The axle 18 is carried through layers 24a (and 47) and 48 to the top of layer 48 and to the top of membrane layer 52.

The second membrane 24b on the body 35 that are disposed on the bottom surface of the body 14 can be patterned to provide either just an adhesive region on the central portion, as shown or in some implementations, the axle 18 can be extended to the backside of the pneumatic driven motor 10 repeating the construction as discussed above.

A pneumatic driven motor 10 element 10 with an axle 18 is thus provided by the body layer 14 that is sandwiched between two 25-50 micron thick body layers (nominally 30 micro thick body layers. Axle 18 can extend to one or both major opposing surfaces of the pneumatic driven motor 10. Another membrane with patterned annular regions (not referenced but like layer 24a) can be affixed to the body layer 35 with appropriately patterned adhesive regions (not shown) on the body layer 35 to extend the axle 18 through layer 24b.

During construction, some removal of portions of the body layers 14, 35 and 48 may occur when patterning adhesive, etc. This removal may be desirable so as to introduce a small amount of thinning of certain of the movable rotatable structures, such as the motor gear 16, pushrod 36 and valves 30, 32, etc.

Figure 6:
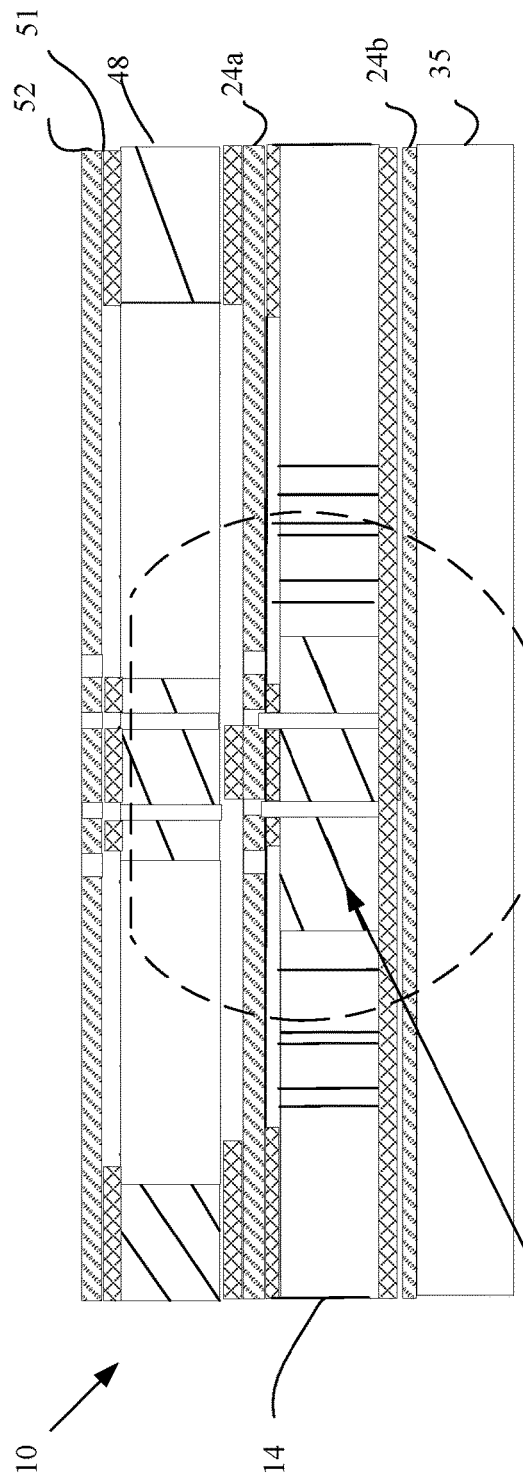
FIG. 6 is a cross-sectional view of a portion of the electrostatic actuated pneumatic driven motor.
Figure 6A:
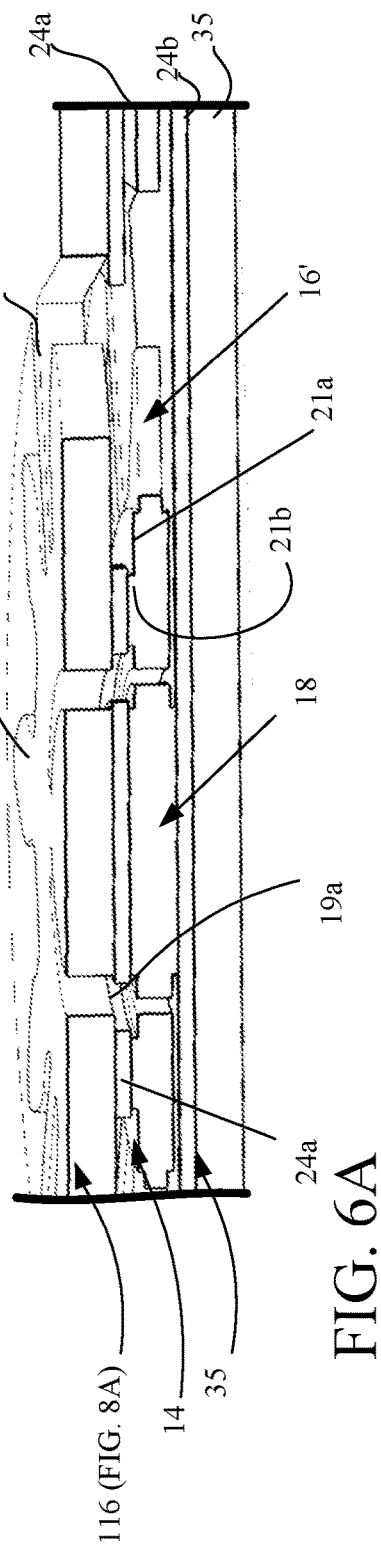
FIG. 6A is an enlarged, cross-sectional view taken along region 6A of FIG. 6.

Referring now to FIG. 6, a stacked arrangement of the body layers 35, 14, and 48 with corresponding membrane layers, 24b, 24a, and 52 is shown. In FIG. 6, the stacked arrangement has the body layer 48 as a generalized rotation transfer layer that can be a mechanism to transfer rotation of the motor gear to a top surface of the membrane 52. In FIG. 6A, discussed below, this body layer 48 is further configured to provide a gear mechanism.

Referring now to FIG. 6A, a gear mechanism 116 (further described in FIGS. 8A, 8B) is shown as a specific implementation of body layer 48 (FIG. 6). The gear mechanism 116 (see FIG. 8A for an example) is disposed over the membrane layer 24a. Shown in FIG. 6A are body layers 35 and 14, membranes 24a, 24b, a gear 112, a bridge member 113a, a shoulder detail 21a and a small width dimension collar 21b about the fixed axle 18. The collar 21b is physically part of the gear 16 and the shoulder detail is a thinned portion of the gear 16 that isolates the bulk of the motor gear 16 from the membranes 24a and 24b. In FIG. 6A, adhesive layers are shown, but not referenced.

Figure 7:
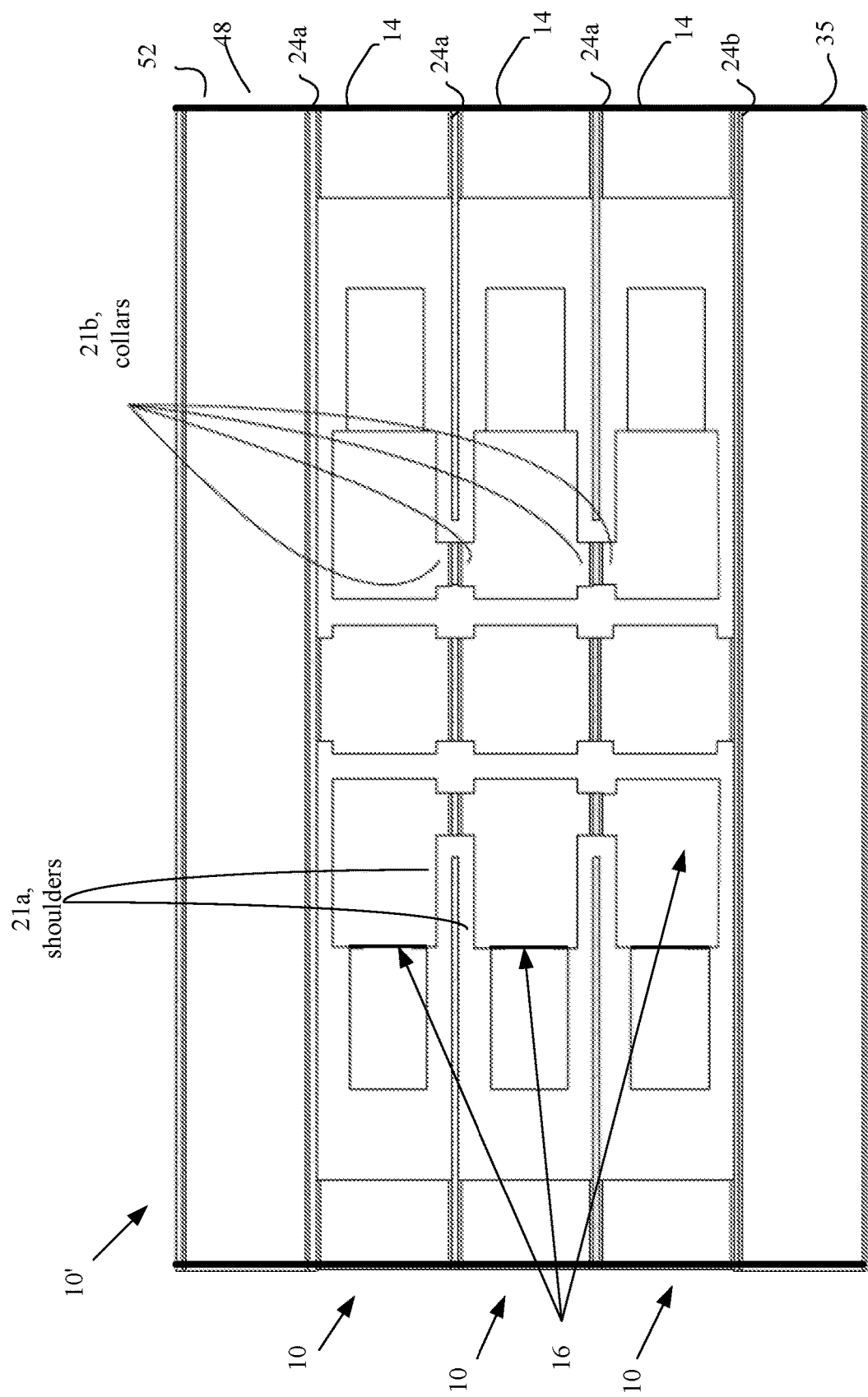
FIG. 7 is a cross-sectional view of a stack of plural micro electrostatic actuated pneumatic driven motors of FIG. 4, with motor portions shown somewhat truncated.

Referring to FIG. 7, a stacked arrangement 10' of three pneumatic driven motors 10 is shown, disposed between body layer 48 and membrane 52 and a bottom layer 35 and membrane 24b. The stacked arrangement 10' includes three pneumatic driven motors 10 (each having a body layer 14 and a membrane 24a). The stack 10' can include top and bottom caps (not shown) or a case (not shown) provided to seal the pneumatic driven motor stack 10'. The caps could be additional body layers that are not patterned, but which are affixed to top and bottom layers of the motor stack 10'.

Also shown in FIG. 7 are the motor gear 16, shoulders 21a and collars 21b about the axle 18 of the motor stack 10'. Note that, in this arrangement, the bottom motor 10 has a collar 21b on the top side only, the middle motor has a collars 21b on both sides, and the top motor 10 has a collar 21b on the bottom side only. Other arrangements are possible.

Thus, while a single pneumatic driven motor 10 was used as the example discussed above in FIGS. 1-6, many pneumatic driven motors 10 can be stacked, e.g., "gang" together to provide a more powerful pneumatic driven motor. The stack 10' of pneumatic driven motors 10 would produce the opposite charge or discharge function on adjacent pneumatic driven motors 10, and concomitant therewith produce opposite directions of travel for the pushrods 36 in adjacent pneumatic driven motors 10. However, the ganged motor would work, presuming that each pneumatic driven motor 10 is constructed for the same rotation direction, because the motor drive pushrod mechanism 36 with pawls 34a, 34b, turns the motor gear 16 in the same rotation direction (here counter-clockwise) regardless of the direction of travel of the pushrod 36.

Micro-Mechanical Force Transfer Device Overview

In some implementations, the pneumatic driven motor 10 can be used with micro mechanical force transfer devices. Micro mechanical force transfer devices described herein are made using micro fabrication methods. The micro mechanical force transfer devices described herein are of the gear type and generally include one or more gears. Plural gears can be intermeshed together in a single module to provide a gear train. Gears can be built up in repeatable layers (of gear modules) to provide complex gearing arrangements of various types. These micro mechanical force transfer devices can be used to accomplish various aspects of mechanical force transfer. For example, the micro mechanical force transfer devices can be used for increasing or decreasing rotational velocity; increasing or decreasing torque, or changing the plane of rotation or changing the direction of rotation (i.e., reversing direction of rotation) of an input force. The input force originates from the motors mentioned above or from other sources. These micro mechanical force transfer devices can find applications in various industrial, commercial, medical, and biological applications. Micro mechanical force transfer device are fabricated on a micron/millimeter scale using roll-to-roll processing techniques that will be discussed below.

Figure 8A:
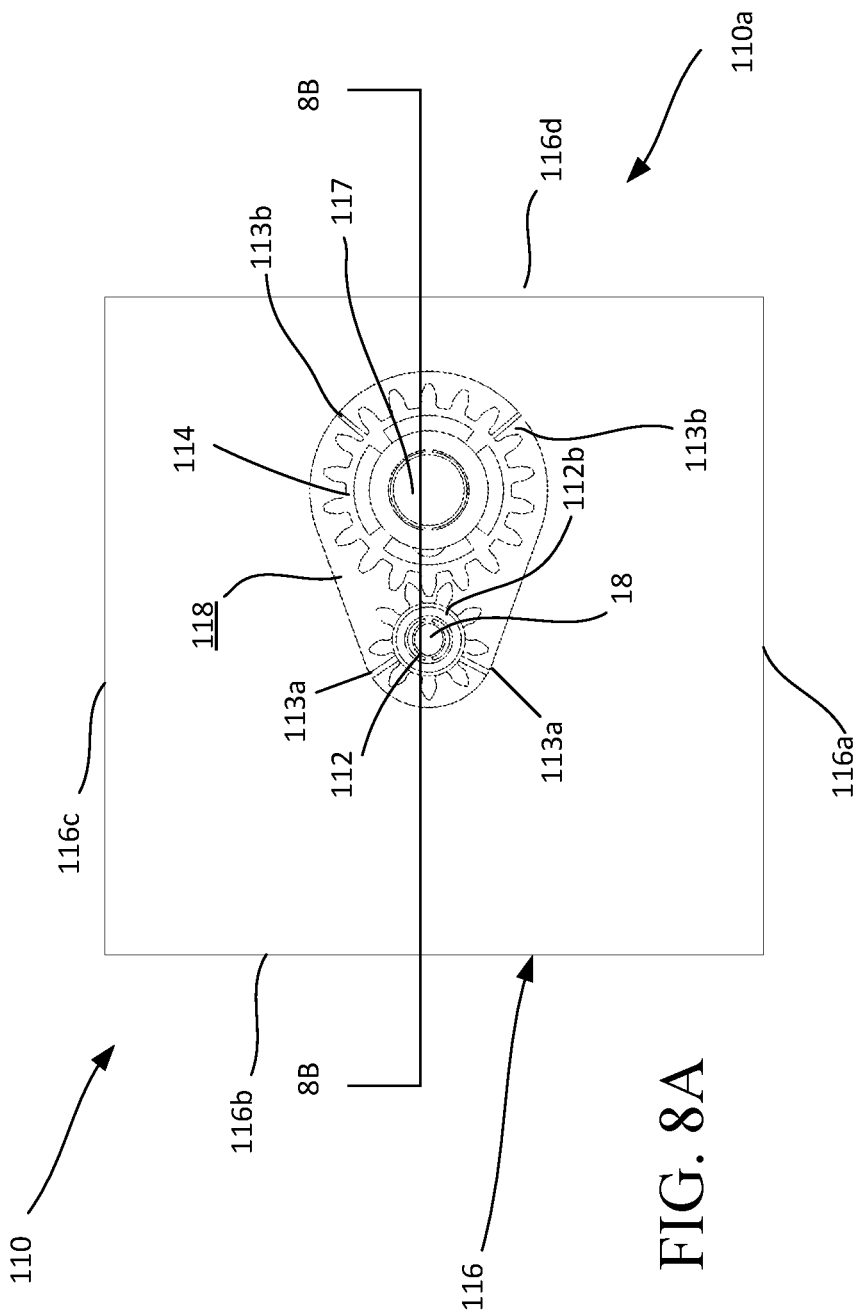
FIGS. 8A, 8B are plan and cross-sectional views respectively of a stage of a micro mechanical force transfer device that can be used with the electrostatic actuated pneumatic driven motor.
Figure 8B:
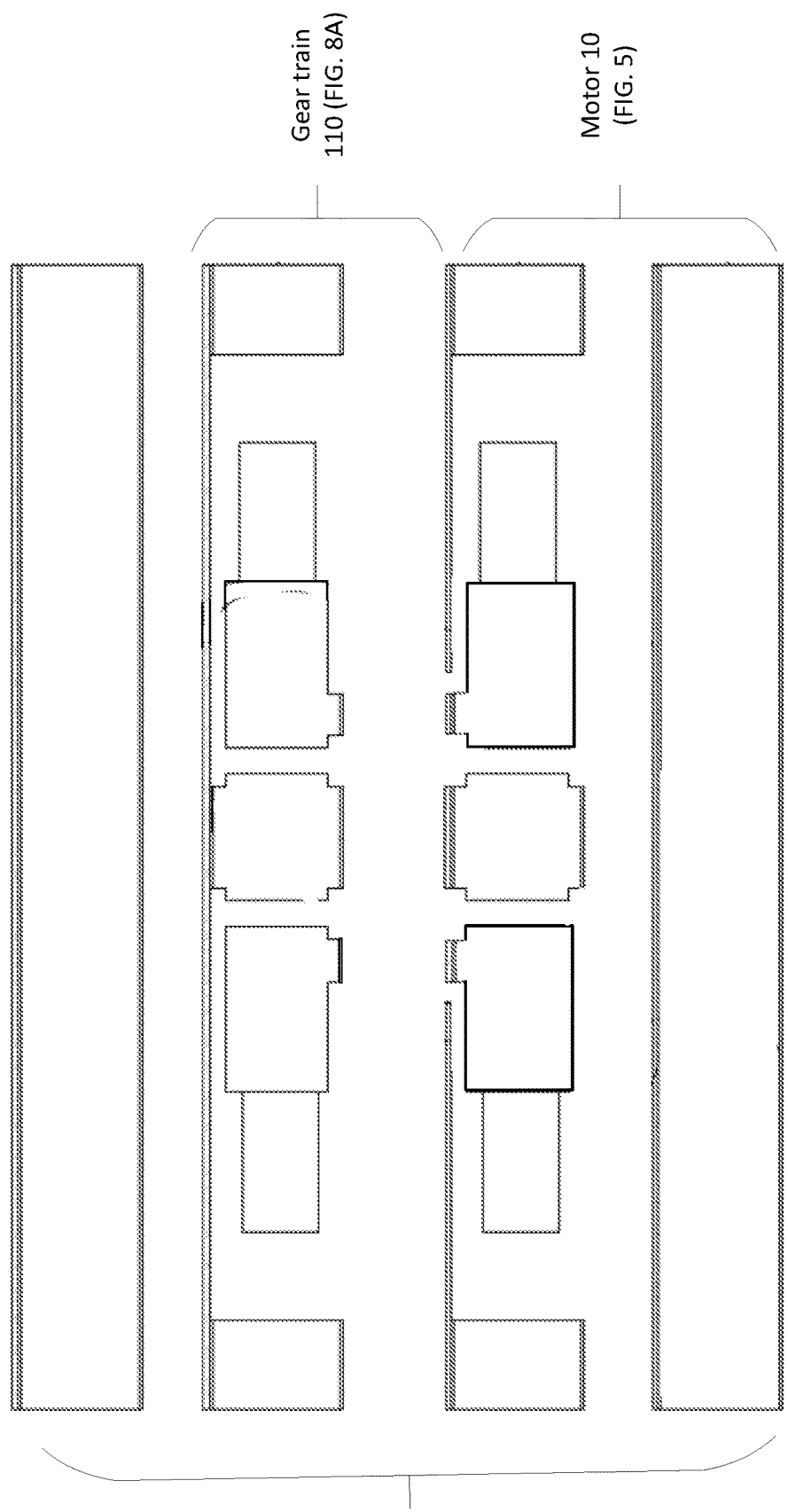

Referring to FIGS. 8A and 8B, a first stage 110a of a micro mechanical force transfer device 110 in a stage of construction is shown. The micro mechanical force transfer device 110 is a gear train device that transfers mechanical force from one driven gear referred to herein as the input gear 112 to another gear referred to herein as the output gear 114. The first stage 110a includes the input gear 112 that is inter-meshed with the output gear 114. Both gear 112 and 114 rotate about axles. Gear 112 rotates about a continuation portion of the axle 18 (FIGS. 1-5, 6, 6A, etc.), whereas gear 114 rotates about an axle 117. (The first stage 110a of the micro mechanical force transfer device 110 is a specific implementation of the body layer 48 and membrane 52 of FIG. 6.) The continuation portion of the axle 18 and the axle 117 are constructed, as discussed in FIGS. 1-4 for the axle 18.

In this example, the first stage 110a of the micro mechanical force transfer device 110 (gear train) reduces rotational speed and increases torque between an input force at the input gear 112 and an output force from the output gear 114. However, a gear train that increases rotational speed and reduces torque between the input gear and the output gear could alternatively be built by the input gear having more teeth than the output gear.

The micro mechanical force transfer device 110 includes a gear body layer 116 supported on a membrane, which in the example shown here, is membrane 24a of the pneumatic driven motor 10 (FIG. 5) and is built up from the pneumatic driven motor 10. (The micro mechanical force transfer device 110 could alternatively be supported on the membrane 52 of the pneumatic driven motor 10 (FIG. 5).)

The gear body layer 116 has plural walls, e.g., four walls 116a-116d, with interior portions of those walls 116a-116d defining an interior chamber 118. The walls, e.g., walls 116a-116d could optionally have ports that provide fluid ingress or egress from an external fluid source and an external fluid sink (not shown). In other embodiments, the walls 116a-116d are solid walls without ports, as shown.

Also shown in FIG. 8A are tether pair members 113a, 113b. These tether members are bridge elements patterned from the gear body 116 and are used to tether the gears 112 and 114 to the gear body 116 during fabrication processes. Tethers (only two shown) 113a, 113b are used to keep moveable, rotatable parts in place during early stages of manufacture, but are removed prior to final assembly. Tethers, as discussed in FIG. 4C, are also included (but not referenced) for the axle 18 and tethers are also included and not referenced for the axle 117. Interior portions of the chamber 118 including gaps between teeth can be filled with a lubricating fluid of a low viscosity to provide fluid lubrication and mechanical damping. The first gear 112 is tethered via the tether elements 113a to the body 116. The second gear 114 is tethered to the gear body 116 by the tether element 113b.

Referring to FIG. 8B, a motor driven assembly 125 is shown and includes the gear train 110 disposed on the pneumatic driven motor 10 over layer 24a. Adhesive layers are patterned to provide for continuation of the axle 18 and to otherwise accommodate the gear 112.

Figure 9:
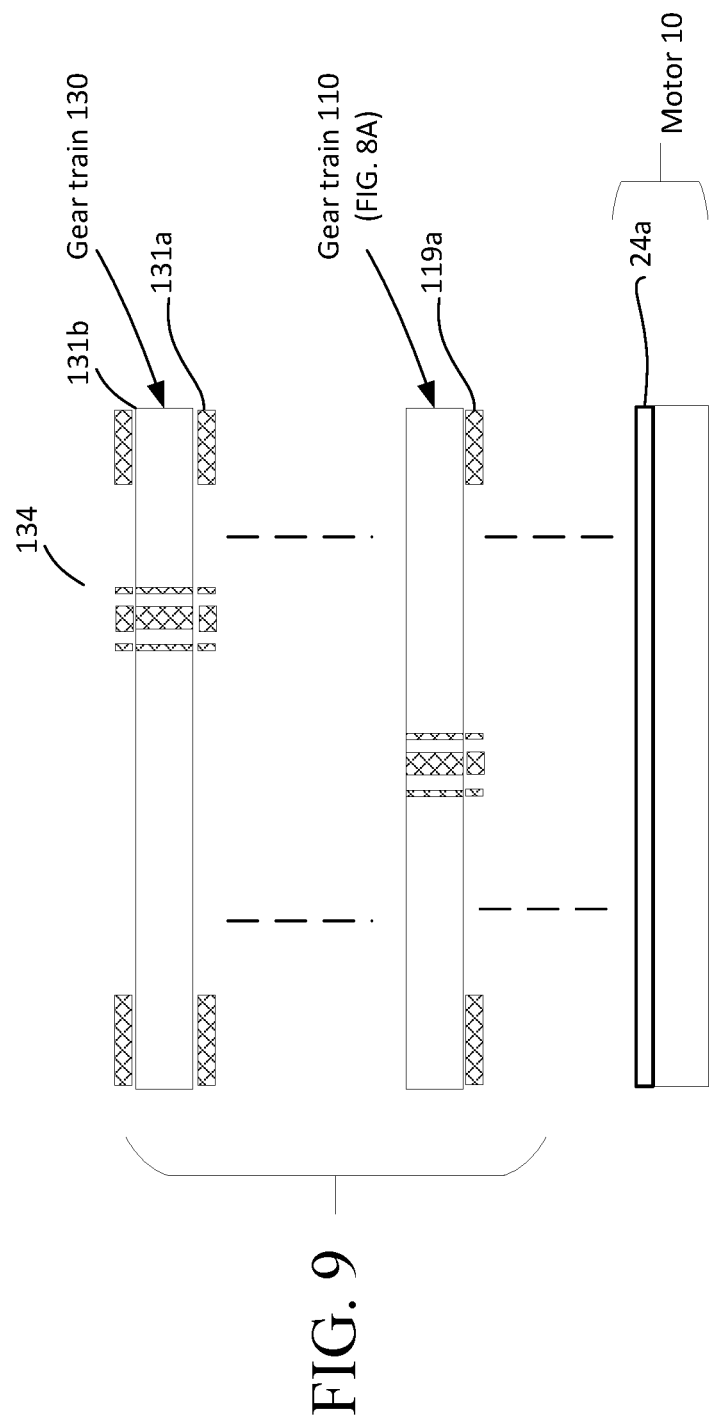
FIG. 9 is a cross-sectional exploded view of an axle implementation of the micro mechanical force transfer device coupling to the motor of any of FIGS. 1-7.

Referring now to FIG. 9, in one implementation the micro mechanical force transfer device comprises plural stages, e.g., gear trains. Gear train 110 (FIG. 8A) is a first stage having the axle 18 that couples to the axle 18 of the pneumatic driven motors 10 or 10' with a second (or additional stages) stacked over the gear train 110. These second or additional stages, such as second stage gear train 130, need not continue (but could continue) the axle 18 to the top of the pneumatic driven motors 10 or 10'. Rather, as shown, the second stage gear train 130 could provide a different axle arrangement 134, that in this instance, would couple to axle 117 (FIG. 8A) about which the second gear 114 (FIG. 8A) rotates, which would transfer the rotational motion of gear 114 to the second stage. Using the principles disclosed herein several stages of gears for the micro mechanical force transfer device can be fabricated for providing various mechanical properties to the motor 10, such as reducing rotational speed and increasing torque, changing rotation direction, etc.

Manufacturing

The pneumatic driven motor 10 and the micro mechanical force transfer device 110 having the above-described features can be manufactured using various methods such as MEMS processing techniques and so-called roll-to-roll (R2R) processing. The materials for the pneumatic driven motor 10 are chosen based on the features to be provided by the pneumatic driven motor 10 and the method of manufacturing of the electrostatic pneumatic driven motor 10. Below are some criteria for choosing the materials of the different parts of pneumatic driven motor 10 for roll-to-roll processing.

Pneumatic Driven Motor 10 Force Transfer Device Body

The material used for the pneumatic driven motor 10 body 14 (as well as bodies 35 and 48 and force transfer bodies) may be defined by the requirements. In general, the material needs to be strong or stiff enough to hold its shape to produce the chamber. In some implementations, the material is etchable or photo sensitive so that its features, e.g., the motor gear 16 and chamber 12, etc., can be defined and machined/developed/extruded/molded. Sometimes it is also desirable that the material interact well, e.g., adheres, with the other materials in the pneumatic driven motor 10. Furthermore, the material is electrically non-conductive. Examples of suitable materials include SU8 (negative epoxy resist), and PMMA (Polymethyl methacrylate) resist.

Membranes—The material for this part can be an elastic material that along with the bodies 14, 35 and 38 or the force transfer bodies carries conductive layers from which forms conductors to electrically connect to the various electrodes are provided. As such, the material is elastic can bend or stretch back and forth. The membrane material is impermeable to the fluids of interest, including gas and liquids, is electrically non-conductive, and can have a high breakdown voltage characteristic. Examples of suitable materials include silicon nitride, and Teflon and PET.

Electrodes—The material of the electrodes is electrically conductive. Because the electrodes do not conduct significant amounts of current, the material can have a high electrical sheet resistance, although the high resistance feature is not necessarily desirable. The electrodes are subject to bending and stretching with the membranes, and therefore, it is desirable that the material is supple to handle the bending and stretching without fatigue and failure. In addition, the electrode material and the membrane material adhere well, e.g., do not delaminate from each other, under the conditions of operation. Examples of suitable materials include very thin layers of gold and platinum. Others are possible such as aluminum.

Other materials—when MEMS processing is used in manufacturing the micro electrostatic pneumatic driven motor 10, a sacrificial filling material, e.g., polyvinyl alcohol (PVA), can be used. The sacrificial filling material may also be used in R2R processing. In some implementations, solvents are used in the manufacturing process, which may place additional requirements on the various building materials of the micro electrostatic pneumatic driven motor 10. It may be possible to print some of the electrical circuit components onto the membranes. In general, while certain materials have been specified above, other materials having similar properties to those mentioned could be used.

End plates (not shown in the figures) can be placed above and below the finished pneumatic driven motor 10 to protect the electrodes and membranes, etc. The finished pneumatic driven motor 10 can be packaged in various types of packages such as those used for integrated circuits.

As mentioned above, while several approaches can be used to fabricate the pneumatic driven motor 10, such as MEMS processing (Microelectromechanical systems) techniques discussed below will be techniques for fabrication by roll-to-roll processing that can also be applied to formation of other types of devices/systems.

Roll-to-Roll Processing for Producing the Micro Pneumatic Driven Motor and the Micro Mechanical Force Transfer Device A roll-to-roll processing line can comprise several stations that can be or include enclosed chambers at which deposition, patterning, and other processing occurs. Processing viewed at a high level thus can be additive (adding material exactly where wanted) or subtractive (removing material in places where not wanted). Deposition processing includes evaporation, sputtering, and/or chemical vapor deposition (CVD), as needed, as well as printing. The patterning processing can include depending on requirements techniques such as scanning laser and electron beam pattern generation, machining, optical lithography, gravure and flexographic (offset) printing depending on resolution of features being patterned. Ink jet printing and screen printing can be used to put down functional materials such as conductors. Other techniques such as punching, imprinting and embossing can be used.

The original raw material roll is of a web of flexible material. In roll-to-roll processing the web of flexible material can be any such material and is typically glass or a plastic or a stainless steel. While any of these materials (or others) could be used, plastic has the advantage of lower cost considerations over glass and stainless steel. Specific materials will be determined according to the application of the micro electrostatic pneumatic driven motor 10. In applications materials such as stainless steel or other materials that can withstand encountered temperatures would be used, such as Teflon and other plastics that can withstand encountered temperatures. With stainless steel, however, there would be considerations of dielectrics need to ensure electrical isolation among the various elements.

For the structure shown, stations within a roll-to-roll processing line are set up according to the processing required. Thus, while the end cap and top caps could be formed on the web or plastic sheet in one implementation the end and top caps are provided after formation of the micro-pneumatic driven motor 10 stack.

Figure 10:
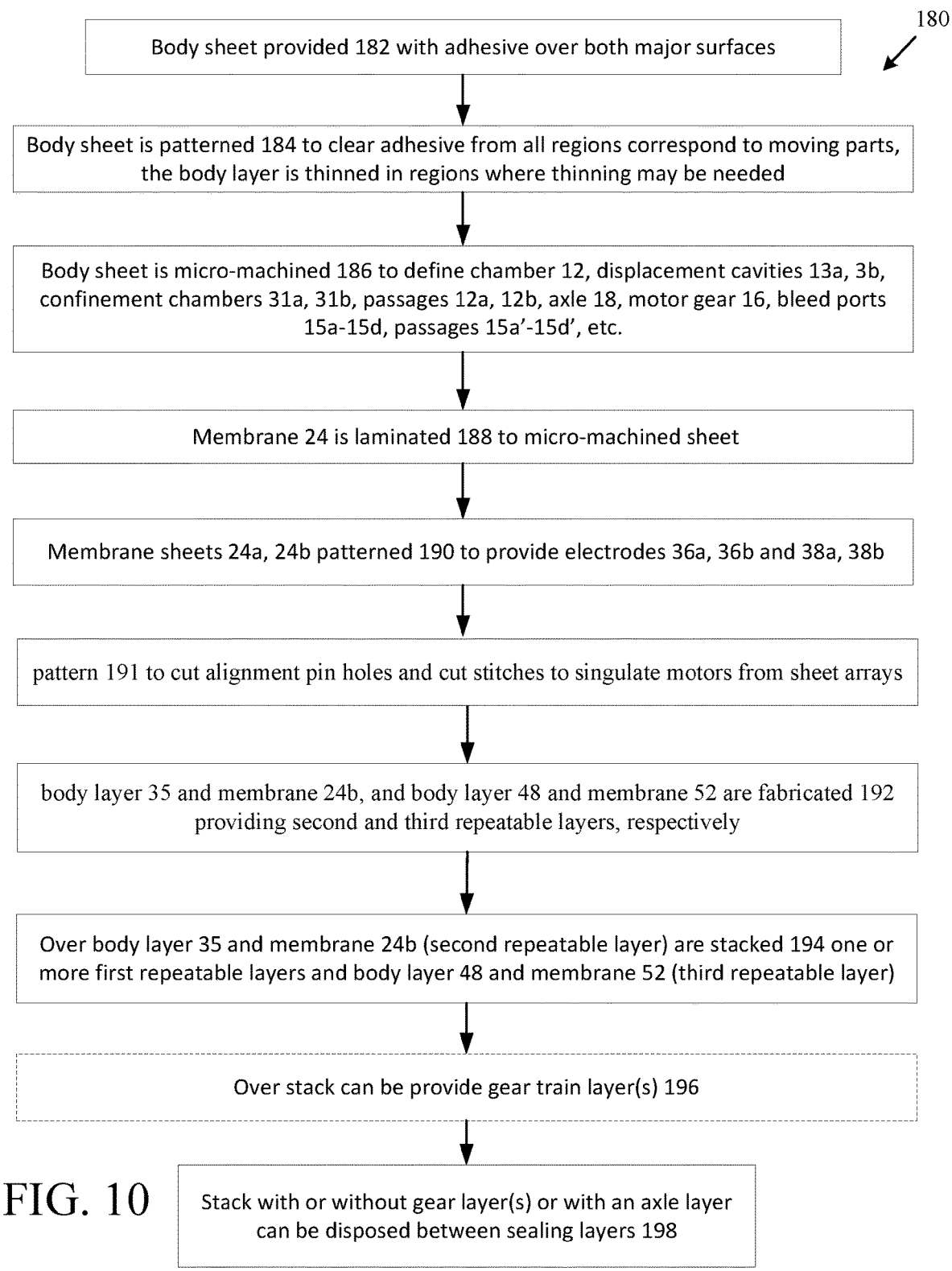
FIG. 10 is flow diagram of roll-to-roll processing for producing the motor and micro mechanical force transfer device structures.

Referring now to FIG. 10, a flow diagram that depicts roll-to-roll processing 180 to provide the pneumatic driven motor 10 is shown (similar processing is used for the micro mechanical force transfer device 110). A sheet of a flexible material (not shown) such a non-metallized 50 micron thick sheet is provided 182 with adhesive over both major surfaces, thereof. This sheet will be used as the body layer 14 (FIG. 1). For the particular implementation the pneumatic driven motor 10, the material is polyethylene terephthalate (PET). Other materials and thicknesses could be used. For example, a 30 micro thick sheet of PET could be used instead. A 30 micro thick sheet of PET would be suitable for forming the displacement volume and other structures of the motor 10. The 30 micro thick sheet of PET can be machined or etched with a deep ultraviolet (DUV) laser and is strong even as finely detailed structures, such as pointed teeth on the motor gear 16.

The sheet with the adhesive is patterned 184 to clear the adhesive from all regions that will correspond to moving parts and the body layer 14 is thinned in regions where thinning may be needed, e.g., moving parts. Thus, for example portions of the sheet correspond to the motor gear 16, the push rod 36 and valves 30, 32 (FIG. 1) do not have regions of adhesive. A mask, (not shown) or direct write, is used with a laser ablation station to remove the adhesive from areas of the sheet within which the those features will be formed. The adhesive can be a polyethylene-based adhesive with a reasonably low activation temperature. The applied thickness is approximately one and one-half microns or thinner. This material is non-conductive to prevent interaction between the drive signals, which can be conveyed through a stack by conductive vias. Conductive ink can be used to run tails from electrodes out to the edge of the motor to connect to wires. The ink provides the interface between the metallized film and the wire but drive signals can be coupled to the layers by vias.

The sheet is micro-machined 186 using another mask (not shown) or direct write to configure a laser ablation station to define the features, as discussed in FIG. 1. Vias are also provided for electrical connections. The micro-machining selectively removes body 14 material to form the chamber 12, gear 16, displacement cavities 13a, 13b, axle 18, bleeder ports 15a-15d, passages 12a-12b, passages 15a'-15d' etc., in the body 14 (FIG. 1). The axle 18 is fixed. Therefore, there is a small gap between the gear 16 (through the membrane and body layer) and the axle 18, and the layer of adhesive.

The sheet with the micro-machined chamber 12, gear 16, and axle 18, etc. is laminated 188 to a membrane sheet, e.g., 5 micron thick sheet of PET with a metallic layer of Al of 100-200 A thickness.

The membrane sheet 24a is patterned 190 to provide the patterned electrodes 36a and 38a carried by the membrane 24a. The membrane sheet 24a is further patterned 191 to cut alignment pin holes and cut stitches to singulate motors from sheet arrays. The gear 16 attached by the tether will not attached to the axle 18 after removal of the tether, allowing the gear 16 to freely rotate within the chamber 12 and about the axle 18. This provides a first repeatable layer.

Similarly, body layer 35 and membrane 24b, and body layer 48 and membrane 52, are fabricated 192 providing second and third repeatable layers, respectively.

Over the body layer 35 and membrane 24b (second repeatable layer) is stacked 194 one or more of the first repeatable layers and over the first repeatable layer(s) is stacked the body layer 48 and membrane 52 (third repeatable layer).

The stack can be disposed 196 between a pair of prefabricated sealing layers disposed on both sides. The sealing layers are 50 micron sheets having an adhesive. The prefabricated sealing layers are patterned to cut electrode access notches for electrical connections.

The stack can be laminated (not shown) with a second pair of prefabricated sealing layers disposed on both sides of the stack, with the sealing layers being 50 micron sheets having adhesive.

Unit Processes—This is a description of the specific processing required to make repeatable layers and stacks.

Adhesive Clearing—A DUV 266 nm laser is used to ablate away the adhesive at this step. Settings for the pulse frequency, power factor and marking speed are determined through a process optimization sequence. These process parameters are then used in conjunction with the toolpath geometry to perform the unit processing.

PET Thinning—The DUV 266 nm laser is used to ablate away the PET at this step. Settings for the pulse frequency, power factor and marking speed are determined through a process optimization sequence. These process parameters are then used to perform the unit processing. Typical thinning is done on a planner basis, but it is possible to produce a non-flat (sloped) profile if the proper toolpath geometry and parameters are used.

PET Cutting—The DUV 266 nm laser is used to ablate away bulk PET at this step. Settings for the pulse frequency, power factor and marking speed are determined through a process optimization sequence. These process parameters are then used to perform the unit processing.

Metal Clearing uses an IR 1064 nm laser to ablate away the metal foil on the PET at this step. Settings for the pulse frequency, power factor and marking speed are determined through a process optimization sequence. These process parameters are then used to perform the unit processing.

Stack Cutting uses the DUV 266 nm laser to ablate away the PET at this step. Settings for the pulse frequency, power factor and marking speed, as well as focus, are determined through a process optimization sequence. These process parameters are then used to perform the unit processing. Because cutting is made through a device that is made of multiple repeatable layers, the overall height becomes an issue, thus laser focus is a consideration as is power, it is desired to have clean cuts on the movable features (valves for example) as well as the edges forming the flow paths.

The above techniques can also use a machine vision system to produce a data file that is used by the laser ablation system in aligning a laser ablation station with a mask (or direct write) such that a laser beam from the laser ablation system provides features according to the mask used in registration with the corresponding portions of the bodies, as discussed. The electrodes are formed by ablating away the metal in regions that are not part of the electrodes and conductors, leaving isolated electrodes and conductors on the sheet.

A jig or test fixture (not shown) can be used in conjunction with the alignment pin holes. Other stacking techniques for assembly are possible with or without the alignment pin holes.

Via conductors to interconnect the patterned electrodes on stacked motors 10 are connected via conductors that are castellated structures, i.e., with relatively wide areas contacting electrodes and relatively narrow areas through holes in the electrodes. This arrangement is provided by having the holes in the body portions larger than the holes through the electrode portions. This can be accomplished during the patterning stages of the body and the electrodes respectively. The via conductors are formed by introduction of the conductive inks mentioned above into the holes.

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

Other embodiments are within the scope of the following claims. For example other techniques to adhere (i.e., affix) layers together could be used such as laser welding, etc.

Figure 11:
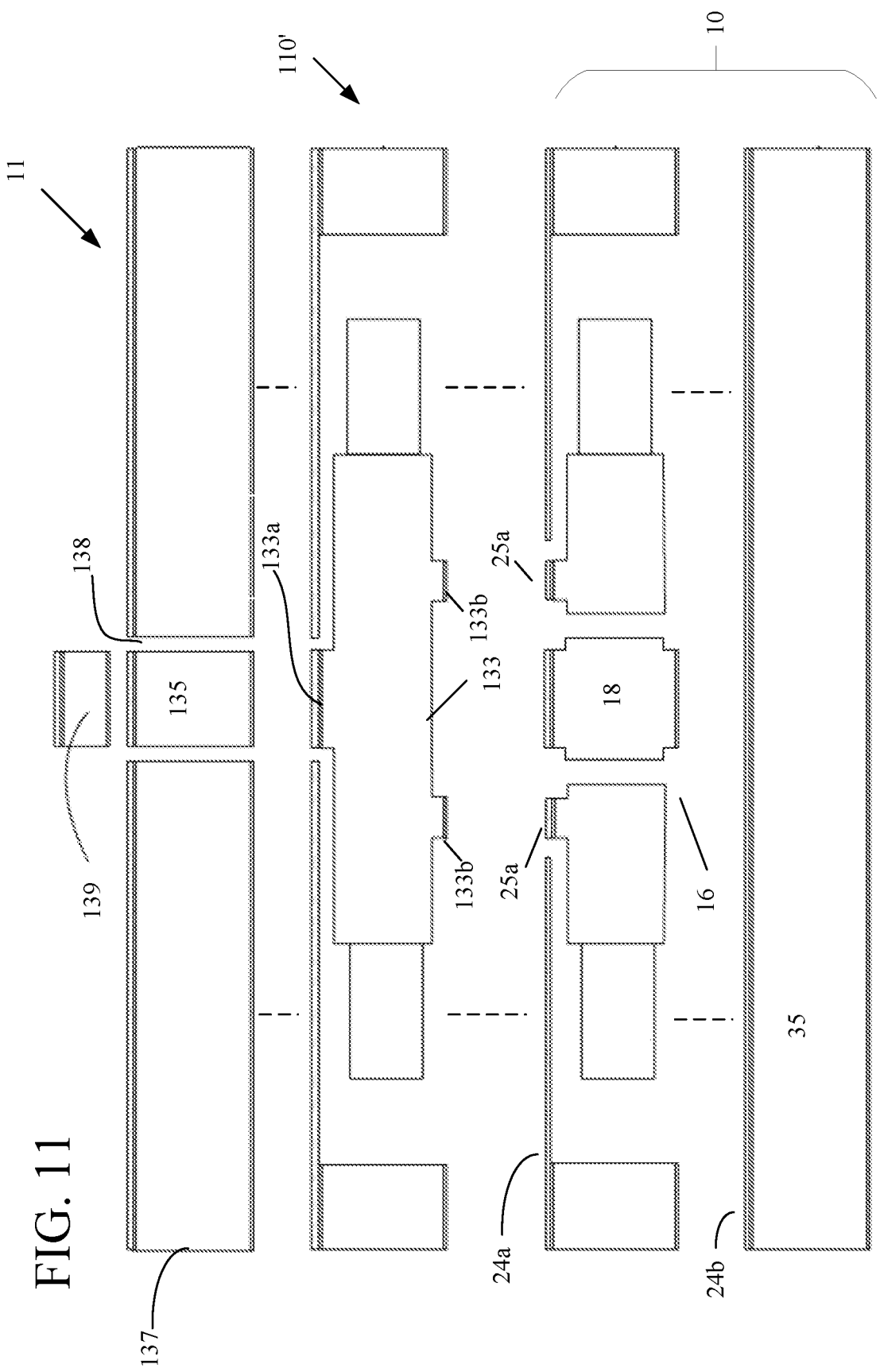
FIG. 11 is an exploded view showing a shaft implementation of the micro mechanical force transfer device coupling to the motor of any of FIGS. 1-7.

Referring now to FIG. 11, an alternative gear train 110' for the pneumatic driven motor 10 is shown having a rotatable shaft 135 (instead of a fixed axle 18) that is carried out to a top portion of the pneumatic driven motor 10. The shaft 135 rotates along with the motor gear 16, whereas in FIGS. 1-4 and 5-9 the motor gear 16 rotates about the fixed axle 18.

In this arrangement, the bottom repeatable layer 35 having the membrane 24*b* is stacked with the body layer 14 and membrane 24*a* (see FIGS. 1-6 for details of construction of these layers). A modified gear train layer 110' (similar to FIGS. 8A-8B in some details) is stacked over layer 24*a*. The gear train layer 110' differs from gear train layer 110 (of FIGS. 8A-8B), as the gear train layer 110' has a gear 133 that on the bottom thereof extensions 133*b* (e.g., an annular region) that make contact to corresponding adhesive portions 25*a* (e.g., an annular adhesive region) on the motor gear 16. The gear 133 has a shaft portion 133*a* on the top surface thereof, which is integrally formed with the gear 133, and which makes contact with the shaft 135 provided in a repeatable layer 137. The shaft 135 is within an aperture 138 of the repeatable layer 137. The shaft 135 contacts a central region of the gear 133 in gear train layer 110' and can make contact to another shaft member 139, as shown.

As another alternative, the motor gear could be integral with a shaft arrangement (not shown), which would rotate along with the motor gear. Such a shaft arrangement could be used instead of the fixed axle implementation. With such a shaft arrangement, the motor gear layer would be constructed similar to that described and illustrated for the gear train layer 110' of FIG. 11 and the repeatable layer 137, etc.

What is claimed is:

1. A pneumatic driven motor comprises:
    a body having first and second surfaces, the body having a chamber defined by an interior wall, a displacement cavity, and a passage that fluidly couples the displacement cavity to the chamber, a bleeder port and a bleeder port passage that fluidly couples the bleeder port to the chamber;
    a valve disposed in the passage between the displacement cavity and the chamber;
    an annular pushrod mechanism coupled to the valve, the annular pushrod mechanism having a pair of pawls that protrude from an inner surface of the annular pushrod mechanism;
    an axle disposed in the chamber; and
    a motor gear disposed about the axle, the motor gear having a plurality of teeth that selectively engage with the pawls on the pushrod mechanism according to displacement of the annular pushrod mechanism.

2. The pneumatic driven motor of claim 1 wherein the body further has a confinement chamber, and the bleeder port is coupled to the chamber through the confinement chamber.

3. The pneumatic driven motor of claim 1, further comprises:
    a first membrane disposed over the first surface and affixed to first portions of the body, the membrane covering at least the displacement cavity.

4. The pneumatic driven motor of claim 3 wherein the body and the membrane are a first body and a first membrane, the pneumatic driven motor further comprising:
    a second body having first and second surfaces; and
    a second membrane disposed over one of the first and second surfaces of the second body, and affixed to at least portions of the second body, with the second membrane covering at least the displacement cavity.

5. The pneumatic driven motor of claim 4 further comprising
first and second electrodes supported on portions of the first and second membranes that are over the displacement cavity.

6. The pneumatic driven motor of claim 5 wherein the electrodes are configurable to receive electrical drive signals that cause flexure of the portions of the first and second membranes over the displacement cavity.

7. The pneumatic driven motor of claim 6 wherein flexure of the first and second membranes is translated into a linear reciprocating motion of the annular pushrod for rotating the motor gear in one direction, through displacement of air from the displacement cavity.

8. The pneumatic driven motor of claim 7 wherein a first state of the electrical signals cause the flexure of the portions of the membranes towards each other displacing air in the displacement cavity and causing linear motion of the pushrod in a first direction, and a second state of the electrical signals cause the flexure of the portions of the membranes away from each other sucking air into the displacement cavity and causing linear motion of the pushrod in a second, opposite direction.

9. The pneumatic driven motor of claim 3 wherein the membrane has an annular aperture in a region of the membrane over the axle, which annular aperture defines a central region of the membrane that is affixed to a surface of the axle.

10. The pneumatic driven motor of claim 7 wherein the annular aperture in the at least one of the first and second membranes is a first annular aperture, and at least one of the first and second membranes has a second annular aperture spaced from the first annular aperture.

11. The pneumatic driven motor of claim 3 wherein the second body and the second membrane are coupled the a first surface of the first body and the first membrane, the pneumatic driven motor further comprising:
a third body having first and second surfaces;
a third membrane disposed over one of the first and second surfaces of the third body, and with the third body affixed to a portion of the first membrane, with the third membrane covering at least the displacement cavity; and
a transfer layer that is coupled to one of the third membrane, with the transfer layer configured to transfer rotation motion of the motor gear to an external portion of the transfer layer by either a shaft or an axle.

12. The pneumatic driven motor of claim 1, further comprising:
a gear mechanism disposed over the body and coupled to the motor gear to transfer rotational motion of the motor gear to the gear mechanism.

13. The pneumatic driven motor of claim 1 wherein the displacement cavity is a first displacement cavity, the valve is a first valve, the bleeder port and the bleeder port passage are a first bleeder port and a first bleeder port passage and the confinement chamber is a first confinement chamber, and the body further has a second displacement cavity, a second valve a second bleeder port, a second bleeder port passage that fluidly couples the second bleeder port to the chamber, and a second confinement chamber.

14. The pneumatic driven motor of claim 13 wherein the body is a first body, the pneumatic driven motor, further comprising:

a first membrane disposed over one of the first and second surfaces of the first body and affixed to at least portions of the first body, with the first membrane covering at least the first and second displacement cavities;
a second body having first and second surfaces; and
a second membrane disposed over one of the first and second surfaces of the second body, and affixed to at least portions of the second body, with the second membrane covering at least the first and second displacement cavities.

15. The pneumatic driven motor of claim 14 wherein the first and second membranes each support a first set of electrodes over the first displacement cavity and a second set of electrodes over the second displacement cavity.

16. The pneumatic driven motor of claim 15 wherein the pneumatic driven motor translates the vertical motion of the first and second membranes using displaced air into a linear reciprocating motion for rotating the motor gear in one direction.

17. The pneumatic driven motor of claim 15 wherein the electrodes are configured to receive electrical drive signals that cause flexure of the portions of the first and second membranes over the first and second displacement cavities.

18. The pneumatic driven motor of claim 17 wherein a first state of the electrical signals cause the portions of the membranes that are over the first displacement cavity to flex towards each other displacing air in the first displacement cavity and cause the portions of the membranes that are over the second displacement cavity to flex away from each other sucking air into the second displacement cavity, and a second state of the electrical signals cause the portions of the membranes that are over the second displacement cavity to flex towards each other displacing air in the second displacement cavity and cause the portions of the membranes that are over the first displacement cavity to flex away from each other sucking air into the first displacement cavity, with the first and second set of electrical signals causing linear, reciprocating motion of the pushrod to rotate the motor gear in one direction.

19. The pneumatic driven motor of claim 13 wherein the first bleeder port and the first bleeder port passage and the second bleeder port and the second bleeder port passage are coupled to the first displacement cavity and the second displacement cavity, and the pneumatic driven motor further comprising:
a third bleeder port and a third bleeder port passage that are coupled to the first displacement cavity; and
a fourth bleeder port and a fourth bleeder port passage that are coupled to the second displacement cavity.

20. The pneumatic driven motor of claim 1 wherein the motor gear has plural gear teeth that are attached to an outer edge of the motor gear at a non-normal angle with respect to the outer edge.

21. The pneumatic driven motor of claim 20 wherein the pawls on the pushrod sequentially engage with the plural gear teeth of the motor gear.

22. The pneumatic driven motor of claim 21 wherein spacing between teeth of the plural teeth of the motor gear, the non-normal angle, and number of teeth are selected such that a single tooth of the plural teeth of the motor gear engages with a corresponding one of the pawls for each displacement of air from the displacement cavity.

23. The pneumatic driven motor of claim 22 wherein engaging with the single tooth turns the motor gear one fraction of a revolution that is given by $\frac{1}{2}n$ where n is the number of teeth on the motor gear.

24. The pneumatic driven motor of claim 22 wherein engaging with two teeth turns the motor gear one fraction of a revolution that is given by 1/n where n is the number of teeth on the motor gear.

25. The pneumatic driven motor of claim 22 wherein spacing between teeth of the plural teeth of the motor gear, a non-normal angle of attachment of the plural teeth to the edge of the motor gear, the number of teeth on the motor gear, and a distance of linear travel of the pushrod, are selected such that the two teeth alternately engage with the corresponding pawls for each displacement of air from the first and second displacement cavities, turning the motor gear one fraction of a revolution given by 1/n where n is the number of teeth on the motor gear.

26. A pneumatic driven motor comprises:
a body having first and second surfaces and having a chamber that is defined by an interior wall, with the body further having first and second displacement cavities and first and second passages that couple the first and second displacement cavities to the chamber, and having a pair of bleeder ports and a pair of bleeder port passages that fluidly couple the pair of bleeder ports to the first and second displacement cavities;
first and second valves disposed in the passages between the first and second displacement cavities and the chamber;
an annular pushrod coupled to the first and second valves, the annular pushrod having a pair of pawls that protrude from an inner surface of the annular pushrod;
an axle disposed in the chamber;
a motor gear disposed about the axle, the motor gear having a plurality of teeth that engage with the pawls on the pushrod; and
first and second membranes disposed over first and second surfaces of the body, the first and second membranes covering the chamber, the first and second displacement cavities, the pair of bleeder ports and the pair of bleeder port passages, and with the first and second membranes each supporting a first set of electrodes over the first displacement cavity and a second set of electrodes over the second displacement cavity.

27. The pneumatic driven motor of claim 26 wherein the pneumatic driven motor translates the vertical motion of the first and second membranes using the displaced air into a linear reciprocating motion for rotating the motor gear in one direction.

28. The pneumatic driven motor of claim 26 wherein the electrodes are configured to receive electrical drive signals that cause flexure of the portions of the first and second membranes over the first and second displacement cavities.

29. The pneumatic driven motor of claim 28 wherein the flexure of the portions of the first and second membranes cause displacement of air from the first and second cavities and cause the pushrod to travel in a linear reciprocating motion, engaging teeth on the motor gear, causing the motor gear to rotate in one direction.

30. The pneumatic driven motor of claim 26 wherein the bleeder ports bleed air that may be trapped in a region between an outlet from each respective displacement cavity and the passage to the chamber.

31. A method of producing a pneumatic driven motor comprises:
patterning a sheet of material to provide from the sheet a frame having walls that define a chamber, a displacement cavity, a passage coupling the displacement cavity to the chamber, a bleeder port and a bleeder port passage coupling the bleeder port to the chamber, a valve in the passage between the displacement cavity and the chamber, and further defining within the chamber an annular pushrod having a pair of pawls, which is coupled to the valve, an axle, and a motor gear;
adhering a first membrane over a first surface of the patterned sheet, with the first membrane carrying a first electrode on a portion of the first membrane that is disposed over the displacement cavity; and
adhering a second membrane over a second, opposing surface of the patterned sheet, with the second membrane carrying a second electrode on a portion of the second membrane that is disposed over the displacement cavity.

32. The method of claim 31, further comprising:
patterning at least one of the first and second membranes to form corresponding annular apertures in regions of the at least one of the first and second membranes, which are over the axle, with the annular apertures defining central regions of the first and second membranes, which central regions of the first and second membranes are affixed to corresponding surfaces of the axle.

33. The method of claim 31 wherein each of the annular apertures are first annular apertures, and the method further comprises:
patterning at least one of the first and second membranes to form a second annular aperture spaced from the first annular aperture.

34. The method of claim 31, further comprising:
forming a transfer layer that is coupled to the at least one of the first and second membranes, with the transfer layer configured to transfer rotation motion of the motor gear to an annular portion of the transfer layer.

35. The method of claim 31, further comprising:
disposing a gear mechanism over at least one of the first and second membranes adhered to the body, with a portion of the gear mechanism having an axle region that is coupled to the axle of the motor gear that transfers rotational motion of the motor gear to the gear mechanism.

36. The method of claim 31 wherein the first and the second membrane each have conductive layers and the method further comprises:
patterning the conductive layer on the first membrane to provide the first electrode and to provide a first conductor to make electrically contact to the first electrode; and
patterning the conductive layer on the second membrane to provide the second electrode and to provide a second conductor to make electrically contact to the second electrode.

* * * * *